US008330498B2

(12) United States Patent
Shionoiri et al.

(10) Patent No.: US 8,330,498 B2
(45) Date of Patent: *Dec. 11, 2012

(54) SENSE AMPLIFIER AND ELECTRONIC APPARATUS USING THE SAME

(75) Inventors: Yutaka Shionoiri, Kanagawa (JP); Kiyoshi Kato, Kanagawa (JP); Munehiro Azami, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/367,397

(22) Filed: Feb. 7, 2012

(65) Prior Publication Data

US 2012/0133437 A1    May 31, 2012

Related U.S. Application Data

(60) Continuation of application No. 12/940,069, filed on Nov. 5, 2010, now Pat. No. 8,149,018, which is a continuation of application No. 12/469,734, filed on May 21, 2009, now Pat. No. 7,847,598, which is a division of application No. 11/458,710, filed on Jul. 20, 2006, now Pat. No. 7,564,271, which is a division of application No. 10/899,048, filed on Jul. 27, 2004, now Pat. No. 7,091,750, which is a division of application No. 10/305,017, filed on Nov. 27, 2002, now Pat. No. 6,768,348.

(30) Foreign Application Priority Data

Nov. 30, 2001 (JP) .................. 2001-366820
Nov. 30, 2001 (JP) .................. 2001-367627

(51) Int. Cl.
*G01R 19/00*    (2006.01)
(52) U.S. Cl. ............................ 327/52; 327/51; 327/54
(58) Field of Classification Search .................. 327/51, 327/52–54, 57; 365/205, 207, 208
See application file for complete search history.

(56) References Cited

U.S. PATENT DOCUMENTS

| | | | |
|---|---|---|---|
| 4,802,130 | A | 1/1989 | Soneda |
| 4,858,195 | A | 8/1989 | Soneda |
| 5,051,952 | A | 9/1991 | Gotou |

(Continued)

FOREIGN PATENT DOCUMENTS

CN    1987103121 A    11/1987

(Continued)

OTHER PUBLICATIONS

Chinese Office Action (Application No. 02154715.7) dated Apr. 6, 2007 with English language translation.

*Primary Examiner* — Long Nguyen
(74) *Attorney, Agent, or Firm* — Fish & Richardson P.C.

(57) ABSTRACT

A sense amplifier according to the present invention for detecting a potential difference of signals input to a first input terminal and a second input terminal, includes a first means for applying voltages corresponding to threshold voltages of first and second transistors to gate-source voltages of the first and second transistors, and a second means for transferring signals input to the first and second input terminals to gates of the first and second transistors. In this case, a threshold variation of the first and second transistors is corrected.

24 Claims, 33 Drawing Sheets

U.S. PATENT DOCUMENTS

| | | | |
|---|---|---|---|
| 5,162,681 A | 11/1992 | Lee | |
| 5,179,301 A | 1/1993 | Hughes | |
| 5,273,919 A | 12/1993 | Sano et al. | |
| 5,528,545 A * | 6/1996 | Takahashi et al. | 327/51 |
| 5,643,826 A | 7/1997 | Ohtani et al. | |
| 5,666,303 A | 9/1997 | Hughes et al. | |
| 5,847,601 A | 12/1998 | Wang | |
| 6,034,567 A | 3/2000 | Umezawa et al. | |
| 6,081,448 A | 6/2000 | Pasotti et al. | |
| 6,087,873 A | 7/2000 | Alexander | |
| 6,087,897 A | 7/2000 | Wang | |
| 6,288,666 B1 | 9/2001 | Afghahi et al. | |
| 6,559,719 B2 | 5/2003 | Sakuragi | |
| 6,566,933 B1 | 5/2003 | Lye | |
| 6,586,990 B2 | 7/2003 | Udo et al. | |
| 6,617,885 B2 | 9/2003 | Lim et al. | |
| 6,768,348 B2 * | 7/2004 | Shionoiri et al. | 327/51 |
| 6,887,745 B2 | 5/2005 | Chen et al. | |
| 7,091,750 B2 * | 8/2006 | Shionoiri et al. | 327/51 |
| 7,221,596 B2 | 5/2007 | Pesavento et al. | |
| 7,289,381 B1 | 10/2007 | Voo | |
| 7,564,271 B2 * | 7/2009 | Shionoiri et al. | 327/51 |
| 7,847,598 B2 * | 12/2010 | Shionoiri et al. | 327/52 |
| 8,149,018 B2 * | 4/2012 | Shionoiri et al. | 327/52 |

FOREIGN PATENT DOCUMENTS

| | | |
|---|---|---|
| EP | 0243169 A2 | 10/1987 |
| JP | 62-252594 A | 11/1987 |
| JP | 62-273694 A | 11/1987 |
| JP | 06-302192 A | 10/1994 |
| JP | 07-183540 A | 7/1995 |
| JP | 07-211081 A | 8/1995 |
| JP | 10-149678 A | 6/1998 |
| JP | 10-303658 A | 11/1998 |
| JP | 11-273381 A | 10/1999 |
| JP | 2001-085988 A | 3/2001 |
| JP | 2001-085989 A | 3/2001 |
| WO | WO9848403 A1 | 10/1998 |

* cited by examiner

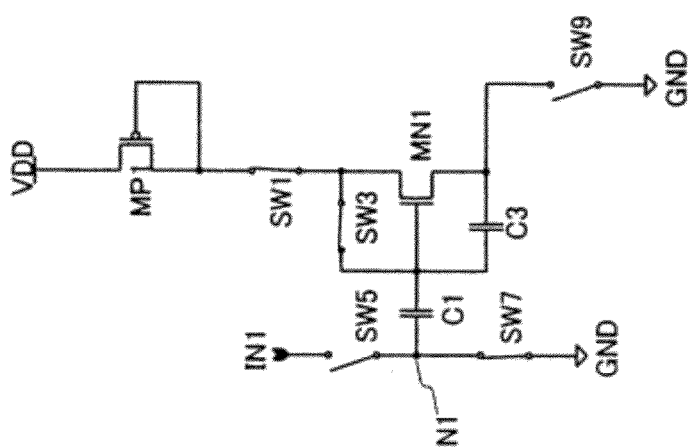
Fig. 3A    Period T1
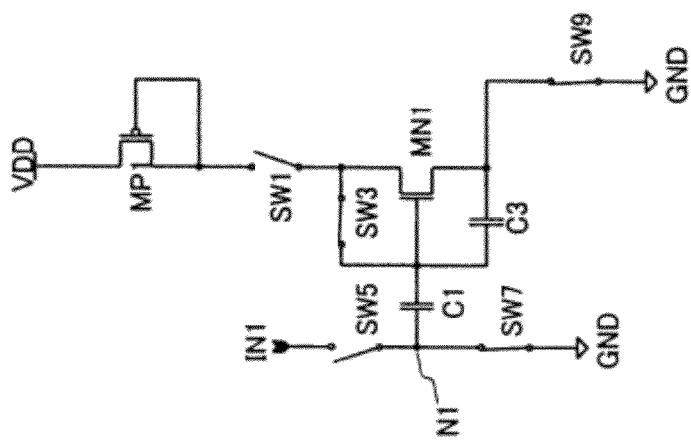
Fig. 3B    Period T2
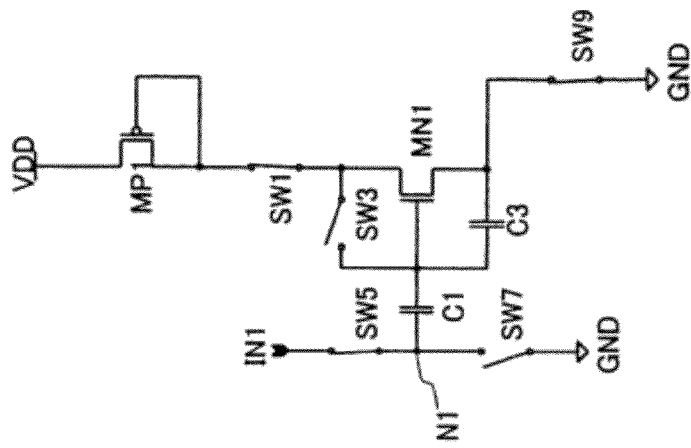
Fig. 3C    Period T3 relative scanning direction of laser light relative scanning direction of laser light

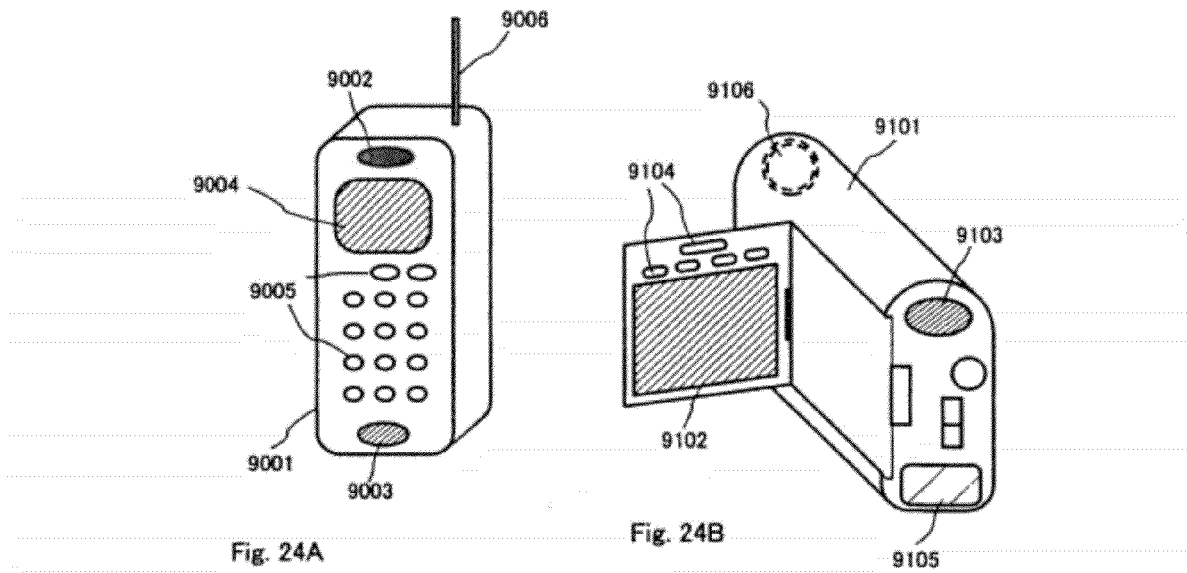
Fig. 24A
Fig. 24B
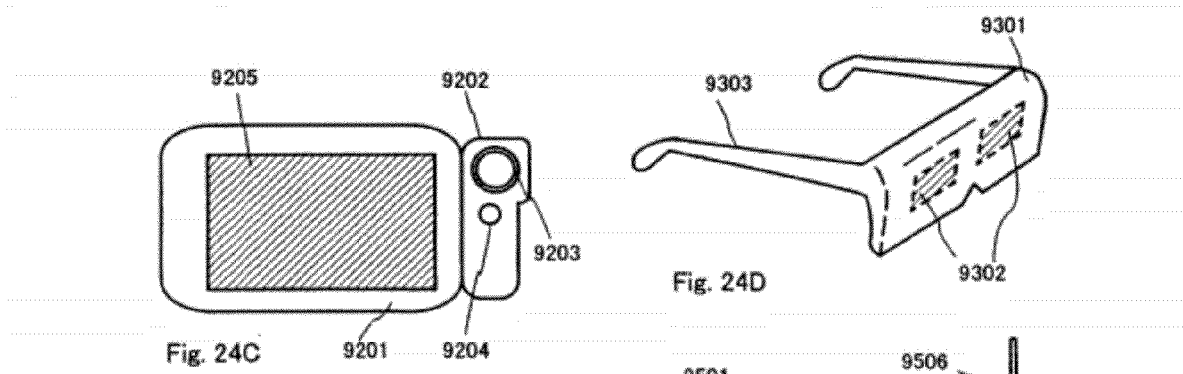
Fig. 24C
Fig. 24D
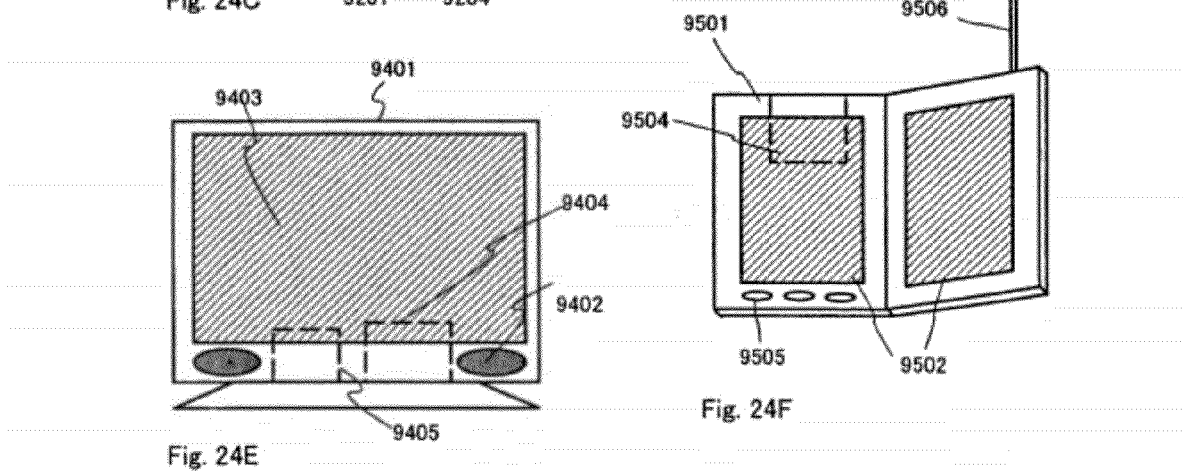
Fig. 24E
Fig. 24F Fig. 29A  Period T1

Fig. 29B  Period T2

Fig. 29C  Period T3

SENSE AMPLIFIER AND ELECTRONIC APPARATUS USING THE SAME

CROSS-REFERENCE TO RELATED APPLICATIONS

This application is a continuation U.S. application Ser. No. 12/940,069, filed Nov. 5, 2010, now U.S. Pat. No. 8,149,018, which is a continuation U.S. application Ser. No. 12/469,734, filed May 21, 2009, now U.S. Pat. No. 7,847,598 which is a divisional of U.S. application Ser. No. 11/458,710, filed Jul. 20, 2006, now U.S. Pat. No. 7,564,271, which is a divisional of U.S. application Ser. No. 10/899,048, filed Jul. 27, 2004, now U.S. Pat. No. 7,091,750, which is a divisional of U.S. application Ser. No. 10/305,017, filed Nov. 27, 2002, now U.S. Pat. No. 6,768,348, which claims the benefit of foreign priority applications filed in Japan as Serial No. 2001-366820 and Serial No. 2001-367627 on Nov. 30, 2001, all of which are incorporated by reference.

BACKGROUND OF THE INVENTION

1. Field of the Invention

The present invention relates to a semiconductor device, particularly to a sense amplifier used in a semiconductor device especially including a thin film transistor.

2. Description of the Related Art

In a semiconductor memory apparatus, a sense amplifier is used for reading stored data. The construction and the operation of an example of a conventional sense amplifier will be described with reference to FIG. 26. In FIG. 26, gates of NMOS transistors MN1 and MN2 are connected to a first input terminal IN1 and a second input terminal IN2, respectively, corresponding to a pair of bit lines. Both sources of the PMOS load transistors MP1 and MP2 are connected to a power source VDD. The PMOS load transistors MP1 and MP2 have a common gate, which is further connected to a drain of the MP1. The drain of the MP1 is connected to the drain of the MN1. The drain of MP2 is connected to the drain of the MN2 and an output terminal OUT. The MN1 and the MN2 have a common source, which is connected to the drain of an NMOS transistor MN3 functioning as a direct current source. The gate and the source of the MN3 are connected to a bias power source V_BIAS and a power source GND, respectively. The sense amplifier shown in FIG. 26 is included in a current mirror type differential amplifier.

In a semiconductor memory apparatus, when stored data is read out, differential potentials, which are opposite in height, occur in a pair of bit lines depending on whether the data is "Hi" or "Lo". The sense amplifier shown in FIG. 26 detects a small potential difference of signals in bit line sent to the first input terminal IN1 and the second input terminal IN2. Then the sense amplifier amplifies and output the result. In other words, when the potential of IN2 is larger than the potential of the IN1, the output terminal OUT outputs "Lo". On the other hand, when the potential of the IN2 is smaller than the potential of the IN1, the output terminal OUT outputs "Hi". In this way, the sense amplifier is used for reading data stored in the semiconductor memory apparatus.

Recently, an active matrix type image display apparatus using an image display device, especially, a thin film transistor (called TFT hereinafter) having a semiconductor thin film on a glass substrate, has been widely spread. The active matrix type image display apparatus (called image display apparatus, hereinafter) using a TFT has hundreds and thousands to several millions TFT's arranged in matrix and controls charges of pixels. Furthermore, a TFT technology (such as polysilicon TFT technology) is evolving recently in which not only pixel TFT is used to construct a pixel but also TFT's are used for forming a drive circuit, a memory circuit, a control circuit and even CPU at the same time.

However, according to the current TFT technology, the variation in characteristic of transistors is larger than that of the technology in which at least one transistor is formed on a single crystal Si substrate. This means that the circuit in the conventional example shown in FIG. 26 is difficult to use in the present TFT technology. For example, it is assumed that threshold values of the NMOS transistors MN1 and MN2 are 1.0 V and 1.5 V, resulting in a difference of 0.5 V. When the potential of the second input terminal IN2 is 0.2 V larger than the potential of the first input terminal IN1, the output OUT should be "Lo". However, in reality, the output OUT is "Hi", resulting in a wrong operation. This is critical when the conventional circuit is used as a read circuit for a dynamic random access memory (DRAM).

When the conventional circuit is used as a read circuit for a static random access memory (SRAM), the potential difference between the input terminals is increased over time. At last, the potential difference absorbs the variation in threshold values of the NMOS transistors MN1 and MN2. Thus, the possibility of causing the wrong operation is decreased. However, the large input potential difference absorbing the threshold variation takes time to obtain. As a result, the reading time becomes longer.

SUMMARY OF THE INVENTION

Accordingly, in view of these problems, it is an object of the present invention to provide a sense amplifier suppressing an effect of the threshold variation. It is another object of the present invention to provide a sense amplifier including TFT's having good characteristics.

In order to achieve these objects, a sense amplifier according to the present invention has a construction as follows:

According to one aspect of the present invention, there is provided a sense amplifier for detecting a potential difference of signals input to a first input terminal and a second input terminal, including a first means for applying voltages corresponding to threshold voltages of first and second transistors to gate-source voltages of the first and second transistors, and a second means for transferring signals input to the first and second input terminals to gates of the first and second transistors, wherein a threshold variation of the first and second transistors are corrected.

The first and second transistors may have a common source, which is connected to a first power source through a first switch.

The first and second transistor may have drains connected to a second power source through second and third switches, respectively.

The drain of the first transistor may be connected to a second power source through a second switch and a first resistor, and the drain of the second transistor may be connected to the second power source through a third switch and a second resistor.

Preferably, the drain of the first transistor is connected to a second power source through a second switch and a third transistor. The drain of the second transistor may be connected to the second power source through a third switch and a fourth transistor. Both gates of the third and fourth transistors may be connected to the drain of the third transistor.

In this case, the first means may include a first switching means for controlling conduction/nonconduction between gates and drains of the first and second transistors, respectively, a second switching means for controlling charging or discharging charges to the drains of the first and second transistors, respectively, and a third switching means for controlling charging or discharging charges to the sources of the first and second transistors.

The second means may be implemented through capacitors between the first and second input terminals and gates of the first and second transistors, respectively. Preferably, the second means may be implemented by having capacitors and switches connected in series between the first and second input terminals and gates of the first and second transistors, respectively, and by having fourth and fifth switches for controlling connection with a third power source at connection nodes of the two pairs of the capacitors and switches, respectively.

According to another aspect of the present invention, there is provided a sense amplifier including a first transistor having a gate connected to a first input terminal, a second transistor having a gate connected to a second input terminal, a third transistor having a source connected to a first power source, and a fourth transistor having a source connected to the first power source. In this case, sources of the first and second transistors are connected to each other. The sense amplifier detects a potential difference of two signals input to the first and second input terminals. The sense amplifier further includes a first means for causing gate-source voltages of the third and fourth transistors to store voltage corresponding to threshold values of the third and fourth transistors. In this case, a threshold variation of the third and fourth transistors is corrected.

The first means may have a first switch between the common source of the first and second transistors and a second power source, a second switch between the gate and the drain of the third transistor, a third switch between the gate and the drain of the fourth transistor, a first capacitor between the gate and the drain of the third transistor, a second capacitor between the gate of the fourth transistor and the drain of the third transistor, a first node where the drains of the first and third transistors are connected to each other, and a second node where the drains of the second and fourth transistors are connected to each other.

Preferably, the first means has a transistor between the source of the first transistor and a second power source, the transistor having a gate connected to a bias power source, a second switch between the gate and the drain of the third transistor, a third switch between the gate and the drain of the fourth transistor, a first capacitor between the gate and the drain of the third transistor, a second capacitor between the gate of the fourth transistor and the drain of the third transistor, a fourth switch between the drain of the first transistor and the drain of the third transistor, and a fifth switch between the drain of the second transistor and the drain of the fourth transistor.

Alternatively, the first means may have a transistor between the source of the first transistor and a second power source, the transistor having a gate connected to a bias power source, a second switch between the gate and the drain of the third transistor, a third switch between the gate and the drain of the fourth transistor, a first capacitor between the gate and the drain of the third transistor, a second capacitor between the gate of the fourth transistor and the drain of the third transistor, a fourth switch between the drain of the first transistor and the drain of the third transistor, a fifth switch between the drain of the second transistor and the drain of the fourth transistor, a sixth switch between the drain of the third transistor and a third power source, and a seventh switch between the drain of the fourth transistor and the third power source.

The sense amplifier is constructed by using a thin film transistor. A semiconductor film functioning as a semiconductor active layer of the thin film transistor is crystallized by laser anneal method using serial oscillating laser light.

Accordingly, the present invention can be applied widely to electronic apparatus in all fields.

BRIEF DESCRIPTION OF THE DRAWINGS

FIGS. 3A to 3C are circuit diagrams each showing a connection in a main period of time for the first embodiment;

FIGS. 24A to 24F are diagrams showing examples of an image display apparatus;

DESCRIPTION OF THE PREFERRED EMBODIMENTS

First Embodiment

Figure 1:
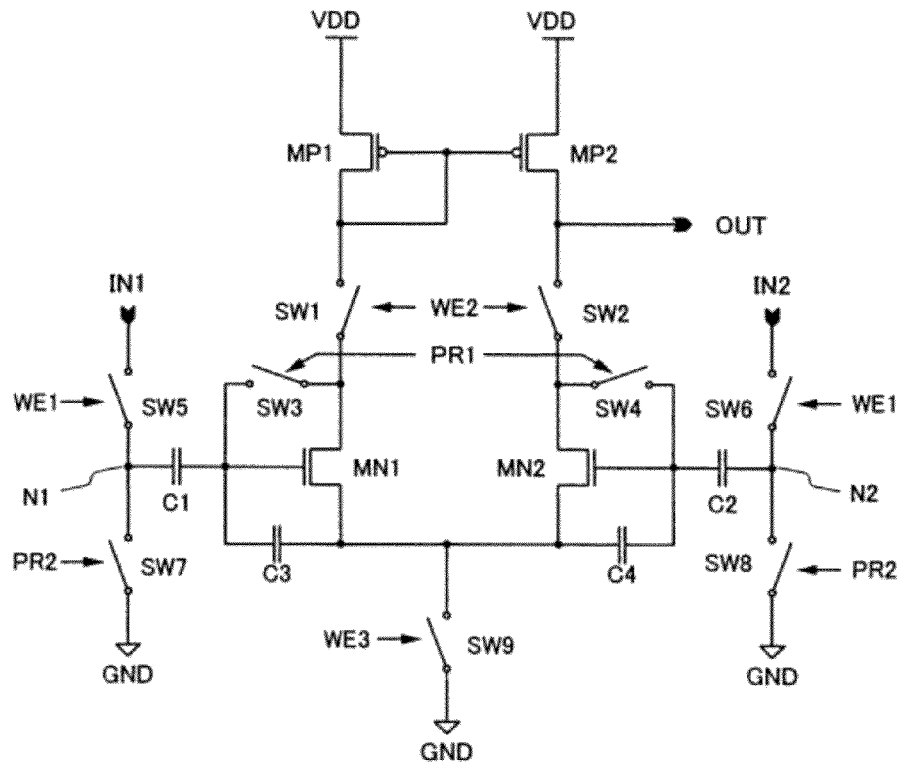
FIG. 1 is a circuit diagram of a first embodiment of the present invention.
Figure 26:
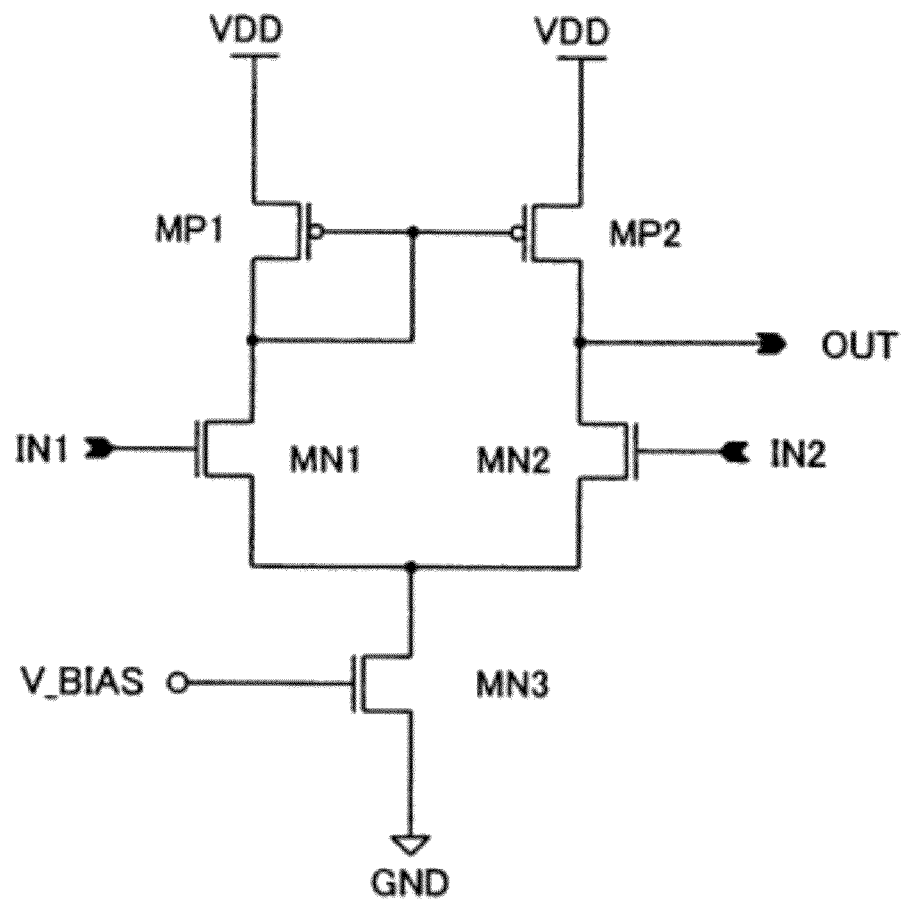
FIG. 26 is a diagram showing an example of a conventional sense amplifier.

A sense amplifier shown in FIG. 1 will be described in this embodiment. First of all, a construction of this embodiment will be described. This embodiment shown in FIG. 1 is different in that switches and capacitors are added to the conventional example shown in FIG. 26. In other words, the connection between the drain of the PMOS transistor MP1 and the drain of the NMOS transistor MN1 is controlled through a first switch SW1. Similarly, the connection between the drain of the PMOS transistor MP2 and the drain of the NMOS transistor MN2 is controlled through a second switch SW2. The connection between the drain and the gate of the NMOS transistor MN1 is controlled through a third switch. Similarly, the connection between the drain and the gate of the NMOS transistor MN2 is controlled through a fourth switch SW4. The first input terminal IN1 and the gate of the NMOS transistor MN1 is node-separated by a fifth switch SW5 and a capacitor C1. In other words, the connection between the first input terminal IN1 and a node N1 is controlled through the fifth switch SW5. The capacitor C1 is added between the node N1 and the gate of the NMOS transistor MN1. Similarly, the second input terminal IN2 and the gate of the NMOS transistor MN2 are node-separated by a sixth switch SW6 and a capacitor C2. In other words, the connection between the second input terminal IN2 and the node N2 is controlled through the sixth switch SW6. Then, the capacitor C2 is added between the node N2 and the gate of the NMOS transistor MN2. The connection between the node N1 and the power source GND is controlled through a seventh switch SW7. Similarly, the connection between the node N2 and the power source GND is controlled through an eighth switch SW8. A capacitor C3 is added between the source and the gate of the NMOS transistor MN1. Similarly, a capacitor C4 is added between the source and the gate of the NMOS transistor MN2. Finally, the connection between the common source of NMOS transistors MN1 and MN2 and the power source GND is controlled through a ninth switch SW9. Control signals (WE1, WE2, WE3, PR1 and PR2) control corresponding switches described in a table in FIG. 1.

Figure 2:
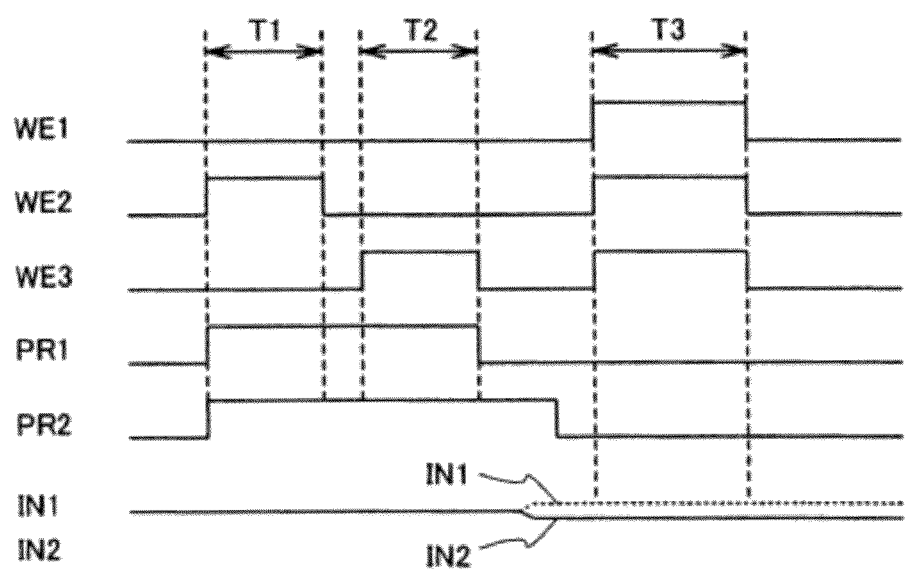
FIG. 2 is an operational timing chart diagram for the first embodiment.

Next an operation of this embodiment will be described with reference to FIG. 2 showing operational timing and FIGS. 3A to 3C showing connection states of switches at main timing. For convenience in the description, the switch corresponding to the respective control signal is conducted when the control signal is "Hi". On the other hand, the switch corresponding to the respective control signal is not conducted when the control signal is "Lo". Because the circuit construction and the circuit operation are symmetrical, only the left half of the circuit in FIG. 1 is extracted and is shown in FIGS. 3A to 3C.

First of all, a period T1 is a period from a state where all of the switches are not conducted because all of the control signals are "Lo" to a state where the control signals WE2, PR1, and PR2 are "Hi". The states of the switches in the period T1 are as shown in FIG. 3A. A lower potential by an amount equal to a voltage equivalent to the threshold voltage of the PMOS transistor MP1 (MP2) is given to the gate potential of the NMOS transistor MN1 (or MN2) from the power source VDD in the period T1.

Next, a period T2 is a period where the control signal WE2 is "Lo" and the control signal WE3 is "Hi". The states of the switches in the period T2 are as shown in FIG. 3B. In the period T2, the charges having been charged to the gate of the NMOS transistor MN1 (MN2) in the period T1 is discharged, such that the gate-source voltage of the NMOS transistor MN1 (MN2) can be equivalent to the threshold value of the NMOS transistor MN1 (MN2). In the period T2, each of the threshold values is stored in the NMOS transistors MN1 and MN2 at the gate-source voltage.

Finally, a period T3 is a period where the control signals WE1, WE2 and WE3 are "Hi" and the control signals PR1 and PR2 are "Lo". The states of the switches in the period T3 are as shown in FIG. 3C. In the period T3, the input signal IN1 (IN2) to the potential corresponding to the gate potential of the NMOS transistor MN1 (MN2) is added over the gate potential fixed in the period T2. The respective threshold values have been written in the gate-source voltages of the NMOS transistors MN1 and MN2 in the period T2. Thus, the potential difference added in the period T3 directly appears in a difference in drive ability of the NMOS transistors MN1 and MN2.

In this way, even when the threshold values of the NMOS transistors MN1 and MN2 differ, the height of the potential of the input signals IN1 and IN2 can be detected accurately. In addition, the accurate detection can be performed when the potential difference between the inputs IN1 and IN2 is still small. Thus, the output can be fixed fast for a short period of time, which allows fast reading.

Second Embodiment

Figure 4:
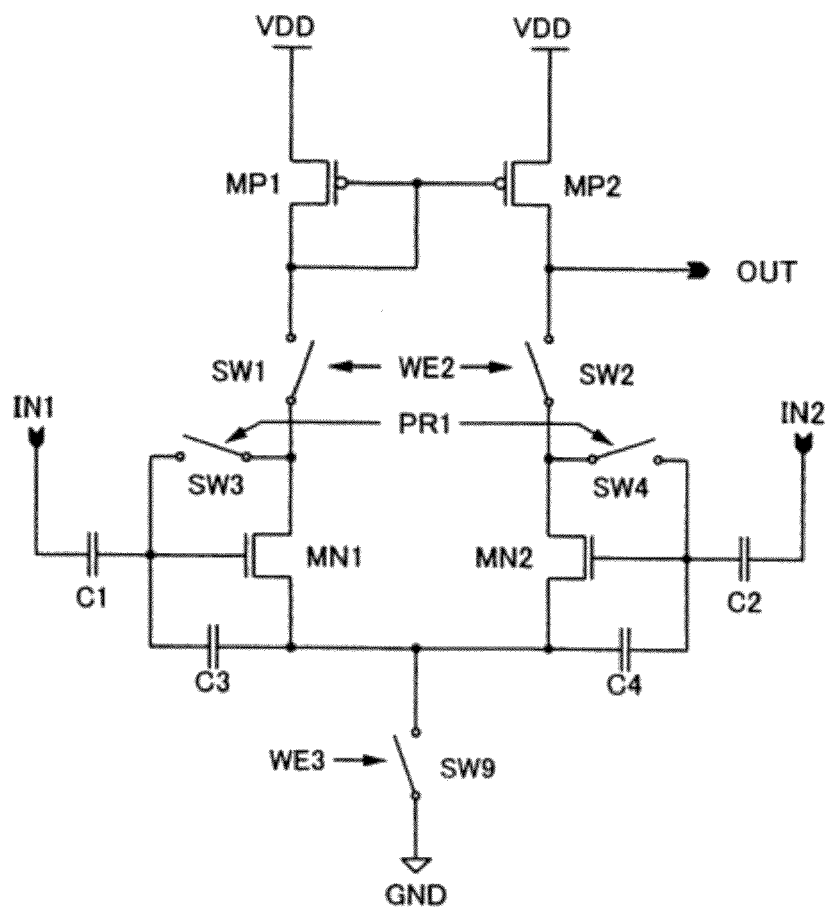
FIG. 4 is a circuit diagram of a second embodiment of the present invention.
Figure 5:
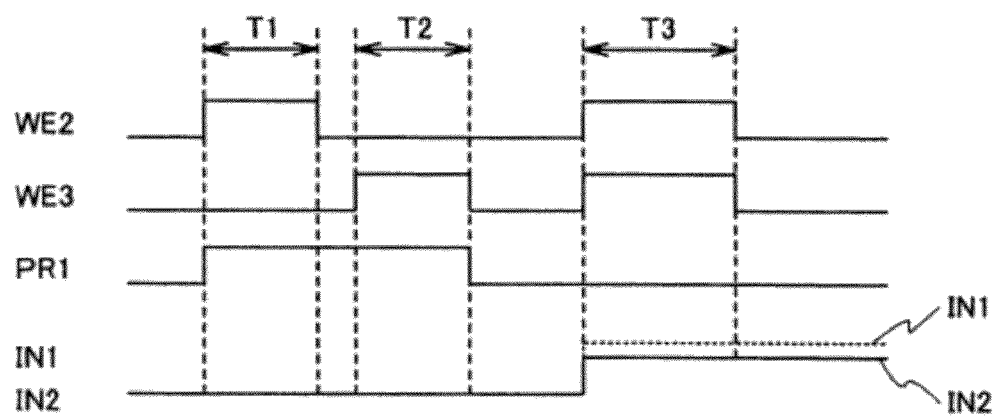
FIG. 5 is an operational timing chart diagram for the second embodiment.

In this embodiment, a sense amplifier shown in FIG. 4 will be described. In this embodiment, as shown in FIG. 4, the fifth switch SW5 to the eighth switch SW8 are removed from the circuit diagram in FIG. 1 in the first embodiment. Then, the input terminals IN1 and IN2 are directly connected to the capacitors C1 and C2. Thus, input signals input from the input terminals IN1 and IN2 are different from those of the first embodiment. As shown in FIG. 5, the input signals maintain the same potential, "Lo" level (equivalent to the power source GND level of the first embodiment) in the period T3. In the period T3, the "Lo" level must be changed to a desired potential levels. In this way, the number of switches can be reduced and, at the same time, the same effect can be obtained as that of the first embodiment.

Third Embodiment

Figure 6:
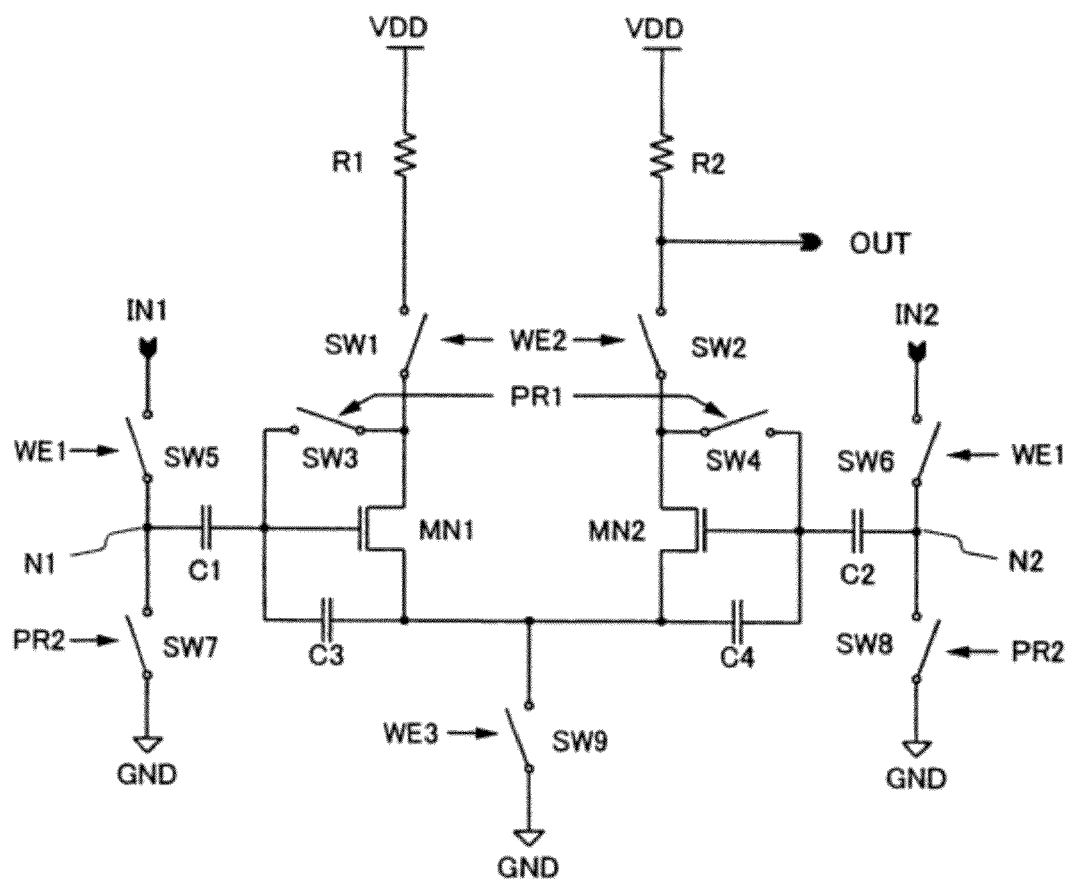
FIG. 6 is a circuit diagram of a third embodiment of the present invention.

In this embodiment, a sense amplifier shown in FIG. 6 will be described. As shown in FIG. 6, this embodiment is different from the first embodiment in that the PMOS transistors MP1 and MP2 in the circuit diagram in FIG. 1 are replaced by resistors R1 and R2. The operational timing in FIG. 2 can be applied to this embodiment. This embodiment is better than the conventional example in that the variation in threshold values is not affected by using a threshold value correcting function.

Fourth Embodiment

Figure 7:
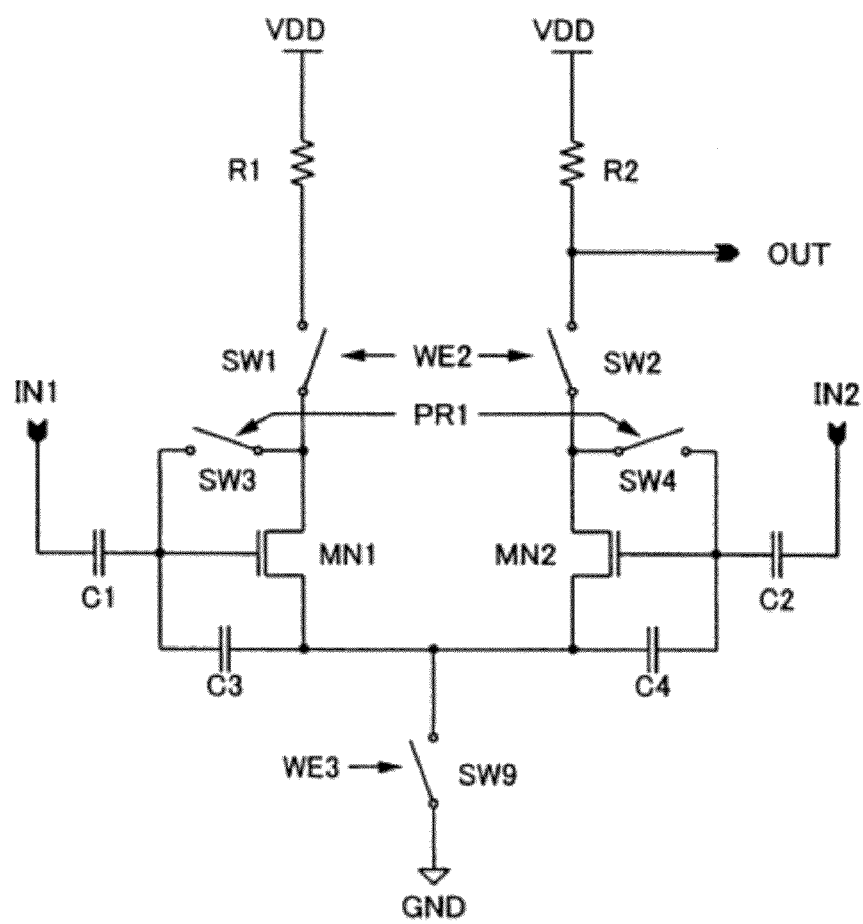
FIG. 7 is a circuit diagram of a fourth embodiment of the present invention.

In this embodiment, a sense amplifier shown in FIG. 7 will be described. As shown in FIG. 7, this embodiment is different from the second embodiment in that the PMOS transistors MP1 and MP2 in the circuit diagram in FIG. 4 are replaced by resistors R1 and R2. The operational timing in FIG. 5 can be applied to this embodiment. This embodiment is better than the conventional example in that the variation in threshold values is not affected by using a threshold value correcting function.

Fifth Embodiment

Figure 8:
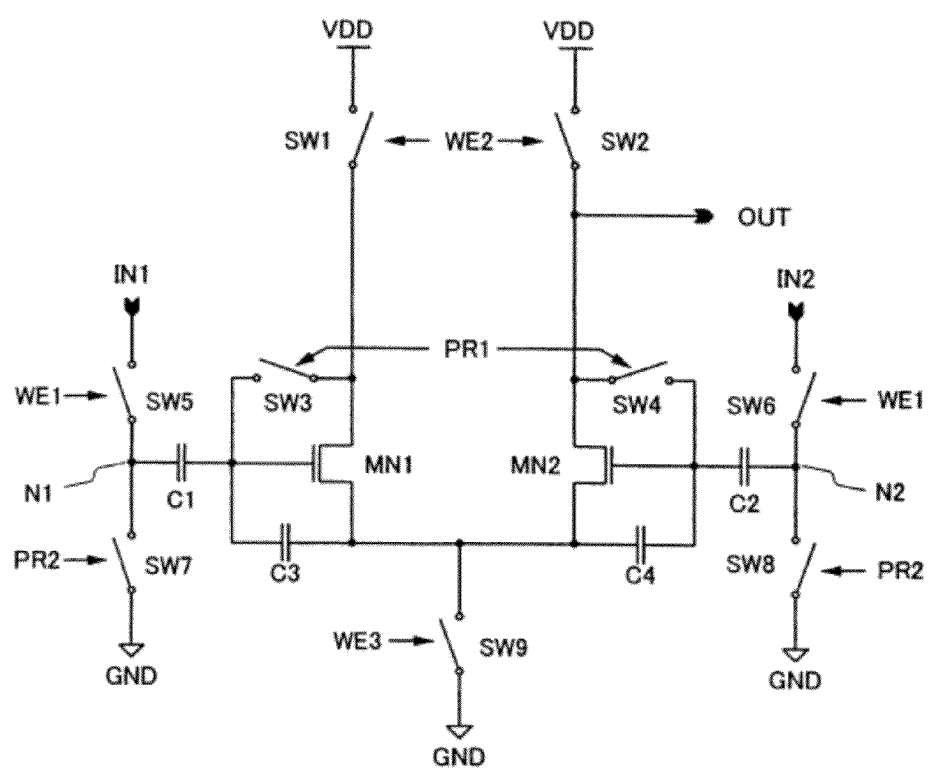
FIG. 8 is a circuit diagram of a fifth embodiment of the present invention.

In this embodiment, a sense amplifier shown in FIG. 8 will be described. As shown in FIG. 8, this embodiment is different from the first embodiment in that the PMOS transistors MP1 and MP2 in the circuit diagram in FIG. 1 are removed and the first switch SW1 and the second switch SW2 are moved to the positions where the PMOS transistors MP1 and MP2 were located before. In this embodiment, both function of the resistor R1 in the third embodiment and switch function are provided to the first switch SW1. The same is true in the second switch SW2, too. The operational timing in FIG. 2 can be applied to this embodiment. This embodiment is better than the conventional example in that the variation in threshold values is not affected by using a threshold value correcting function.

Sixth Embodiment

Figure 9:
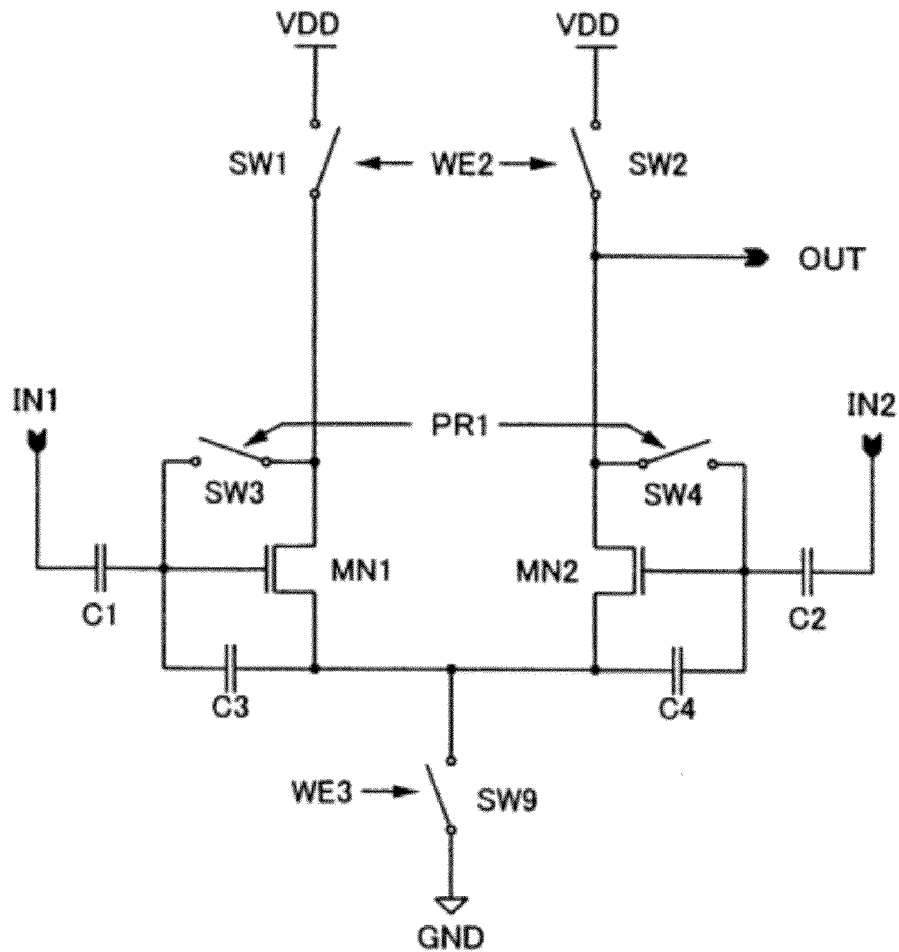
FIG. 9 is a circuit diagram of a sixth embodiment of the present invention.

In this embodiment, a sense amplifier shown in FIG. 9 will be described. As shown in FIG. 9, this embodiment is different from the first embodiment in that the PMOS transistors MP1 and MP2 in the circuit diagram in FIG. 4 according to the second embodiment are removed and the first switch SW1 and the second switch SW2 are moved to the positions where the PMOS transistors MP1 and MP2 were located before. The operational timing in FIG. 5 can be applied to this embodiment. This embodiment is better than the conventional example in that the variation in threshold values is not affected by using a threshold value correcting function.

Seventh Embodiment

Figure 27:
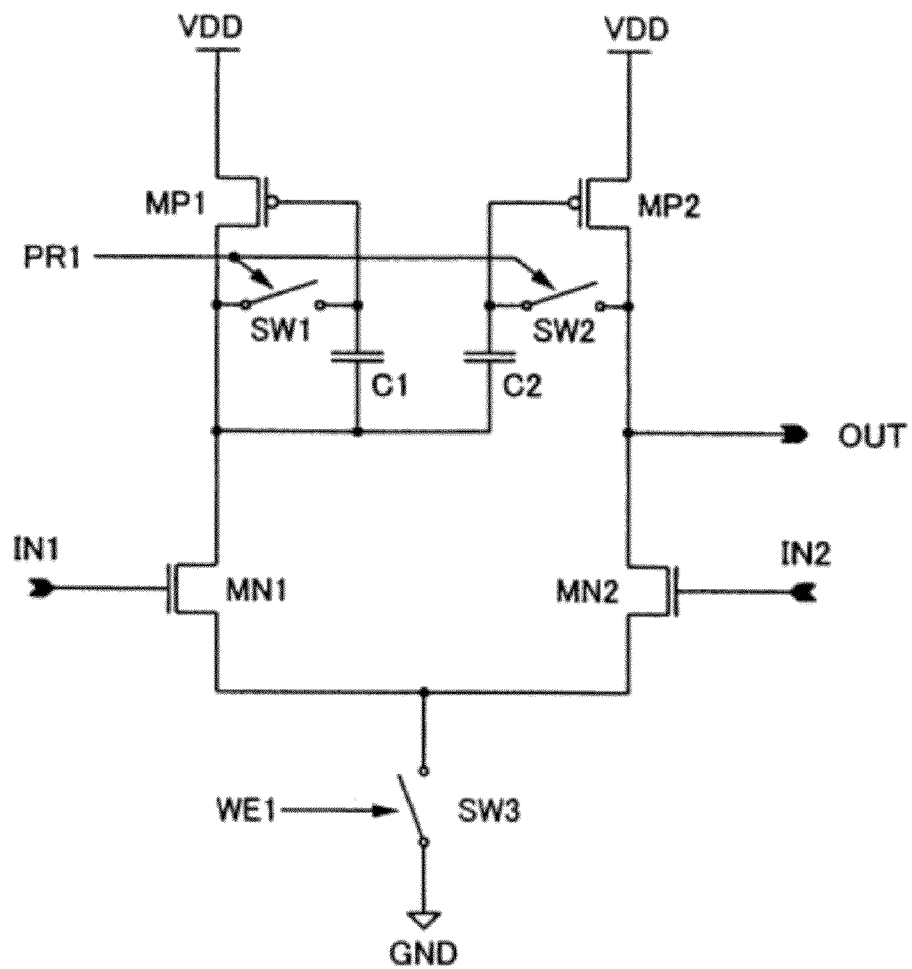
FIG. 27 is a circuit diagram of a seventh embodiment of the present invention.

In this embodiment, a sense amplifier shown in FIG. 27 will be described. First of all, a construction of this embodiment will be described. This embodiment shown in FIG. 27 is different from the conventional example shown in FIG. 26 in that switches and capacitor are added or are replaced therein. In other words, the first switch SW1 and the first capacitor C1 are connected in parallel between the gate and the drain of the first PMOS transistor MP1. The second switch SW2 is connected between the gate and the drain of the second PMOS transistor MP2. The second capacitor C2 is connected between the gate of the second PMOS transistor MP2 and the drain of the first PMOS transistor MN. The third NMOS transistor MN3 in the conventional example is replaced by a third switch SW3 in this embodiment. A control signal PR1 controls ON/OFF of the first switch SW1 and the second switch SW2. A control signal WE1 controls ON/OFF of the third switch SW3.

Figure 28:
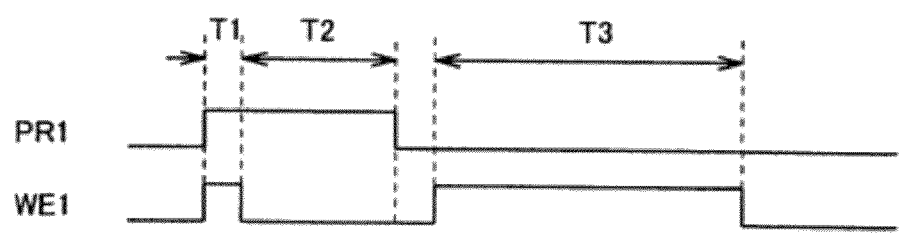
FIG. 28 is an operational timing chart diagram for the seventh embodiment.
Figure 29:
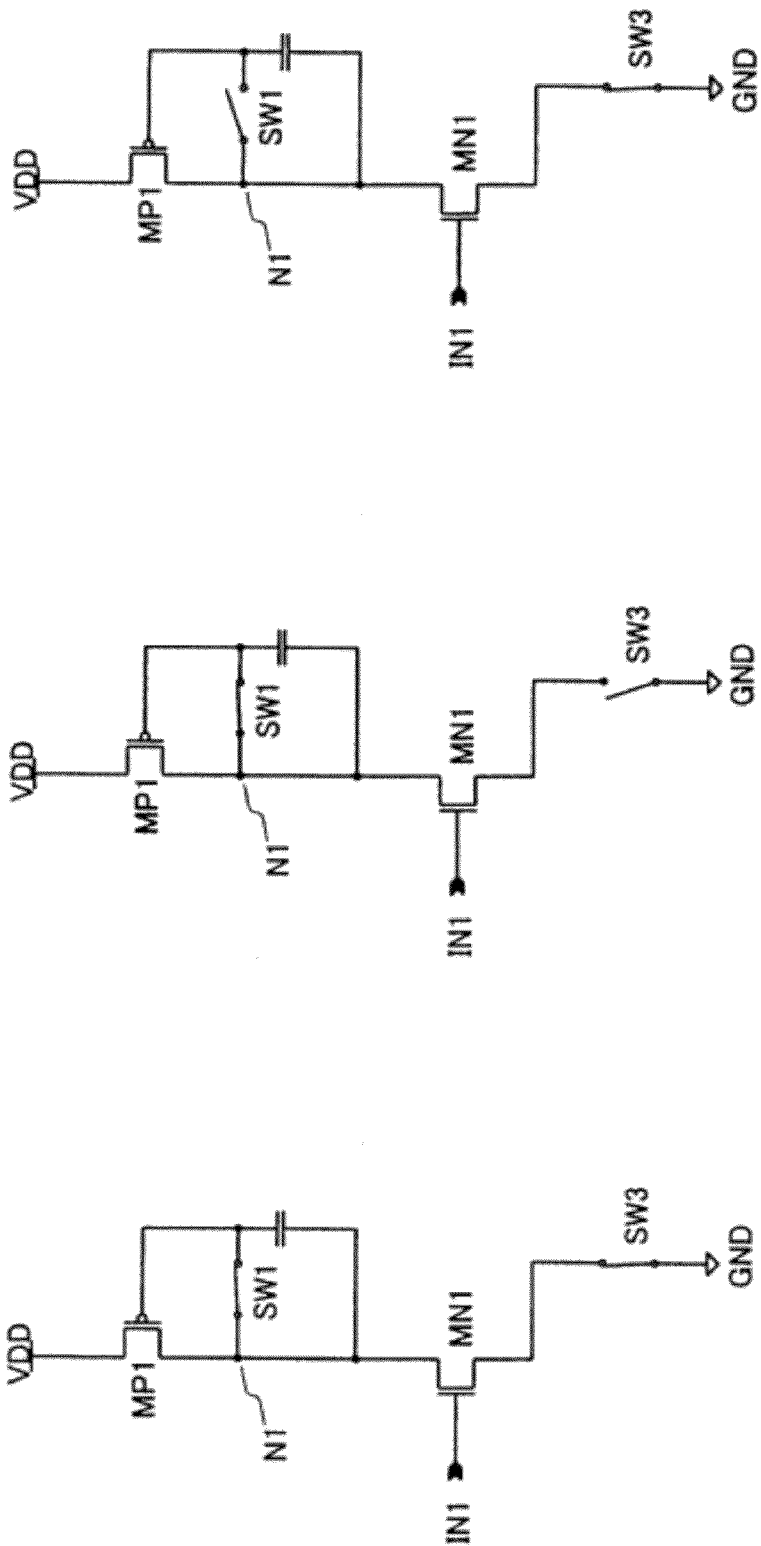
FIGS. 29A to 29C are circuit diagrams each showing a connection in a main period for the seventh embodiment.

Next, an operation of this embodiment will be described with reference to FIG. 28 showing operational timing and FIGS. 29A to 29C showing connection states of switches at main timing. For convenience in the description, when a control signal is "Hi", the corresponding switch is ON. When the control signal is "Lo", the corresponding switch is OFF. Because the circuit construction and the circuit operation are symmetrical, only the left half of the circuit in FIG. 1 is extracted and is shown in FIGS. 29A to 29C.

First of all, a period T1 is a period from a state where all of the switches are OFF because the two control signals PR1 and WE1 are "Lo" to a state where the two control signals WE1 and PR1 are "Hi". The states of the switches in the period T1 are as shown in FIG. 3A. In the period T1, the PMOS transistor MP1 (MP2) and the NMOS transistor MN1 (MN2) are turned on so that direct current can flow between the power sources VDD and GND. Therefore, in this period T1, the drain and gate potentials of the PMOS transistor MP1 (MP2) are smaller than the power source VDD by an amount equal to or more than the potential equivalent to the threshold voltage of PMOS transistor.

Next, a period T2 is a period where the control signal PR1 is "Hi" and the control signal WE1 is "Lo". The states of the switches in the period T2 are as shown in FIG. 3B. In the period T2, the third switch is turned OFF. Thus, charges are supplied from the power source VDD to the gate and the drain of the PMOS transistor MP1 (MP2), which is turned ON in the period T1. As a result, the potentials of the gate and the drain are increased. The increases stop when the gate-source voltage of the PMOS transistor MP1 (MP2) reaches to a voltage equivalent to the threshold value of the PMOS transistor MP1 (MP2), and current no longer flows. In the period T2, each of the threshold values is stored in the PMOS transistors MP1 and MP2 at the gate-source voltage.

Finally, a period T3 is a period where the control signal PR1 is "Lo" and the control signal WE1 is "Hi". The states of the switches in the period T3 are as shown in FIG. 3C. In the period T3, input signals transmitted to two input terminals IN1 and IN2 are read actually. By turning On the third switch SW3, current flows between the power sources VDD-GND. As a result, the drain potential of the PMOS transistor MP1 is decreased. The potential corresponding to the voltage decrease is subtracted from the gate potential of the PMOS transistor MP1 (MP2) fixed in the period T2. The respective threshold values have been written in the gate-source voltages of the PMOS transistors MP1 and MP2 in the period T2. Thus, the potential subtracted in the period T3 is directly reflected on the drive ability of the PMOS transistors MP1 and MP2 and does not depend on the threshold values.

In this way, even when the threshold values of the PMOS transistors MP1 and MP2 differ, the height of the potential of the input signals IN1 and IN2 can be detected accurately. In addition, the accurate detection can be performed when the potential difference between the inputs IN1 and IN2 is still small. Thus, the output can be fixed fast for a short period of time, which allows fast reading.

Eighth Embodiment

Figure 30:
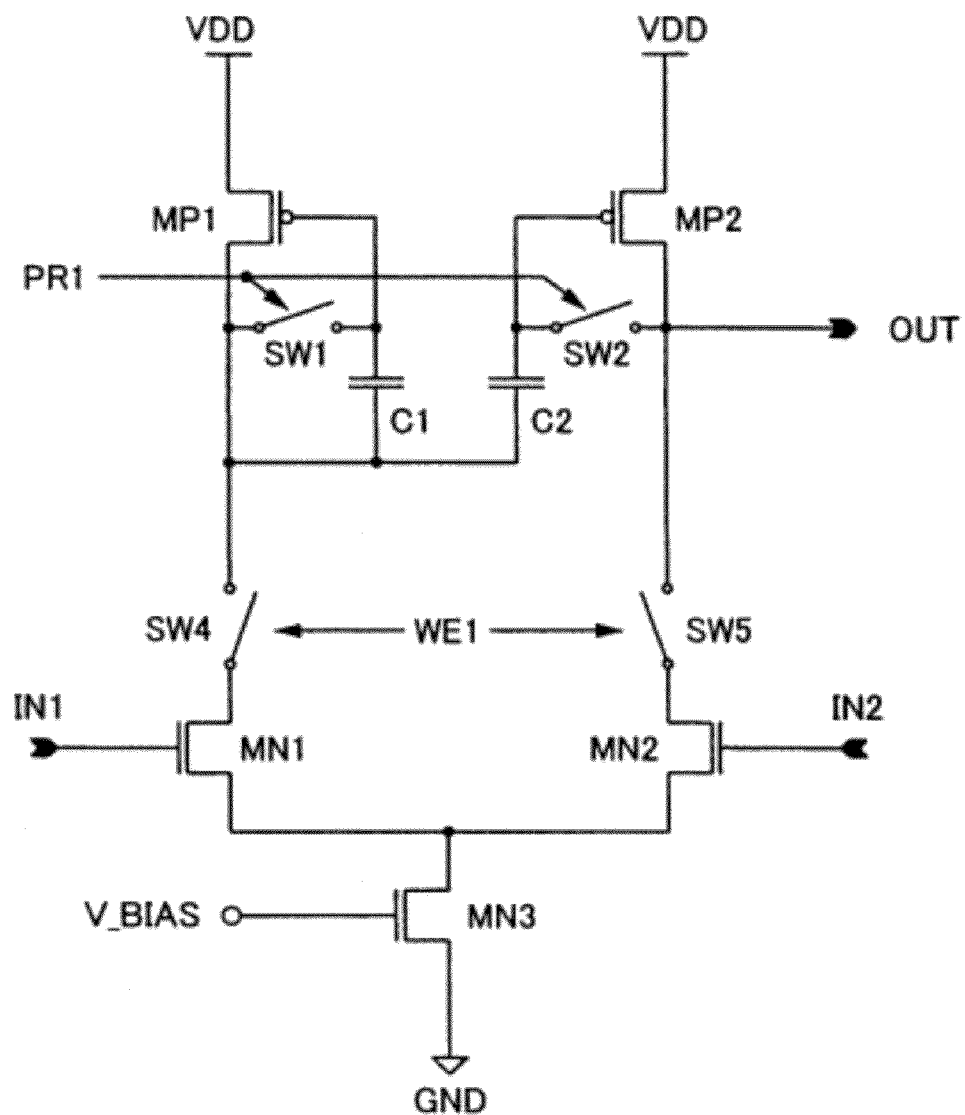
FIG. 30 is a circuit diagram of an eighth embodiment of the present invention.

In this embodiment, a sense amplifier shown in FIG. 30 will be described. As shown in FIG. 30, this embodiment is different from the seventh embodiment in that, in the circuit shown in FIG. 27, the third switch is replaced by an NMOS transistor MN3 biased at all times, and a fourth switch SW4 is provided between the drain of the PMOS transistor MP1 and the drain of the NMOS transistor MN1. In addition, a fifth switch SW5 is provided between the drains of the PMOS transistor MP2 and the NMOS transistor MN2. The fourth switch SW4 and the fifth switch SW5 are controlled to turn ON/OFF through the control signal WE1. In this embodiment, the two control signals PR1 and WE1 are input at operational timing shown in FIG. 28 like the seventh embodiment. This embodiment functions like the seventh embodiment even though the number of switches increases.

Ninth Embodiment

Figure 31:
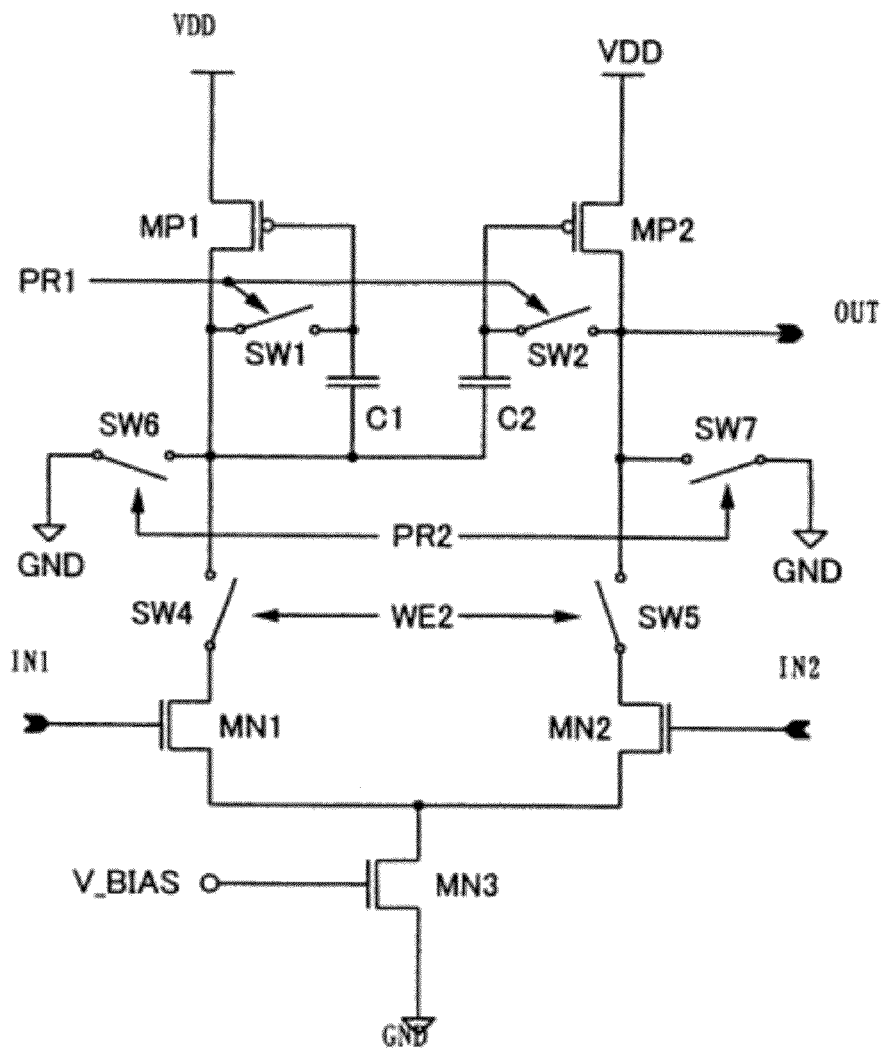
FIG. 31 is a circuit diagram of a ninth embodiment of the present invention.
Figure 32:
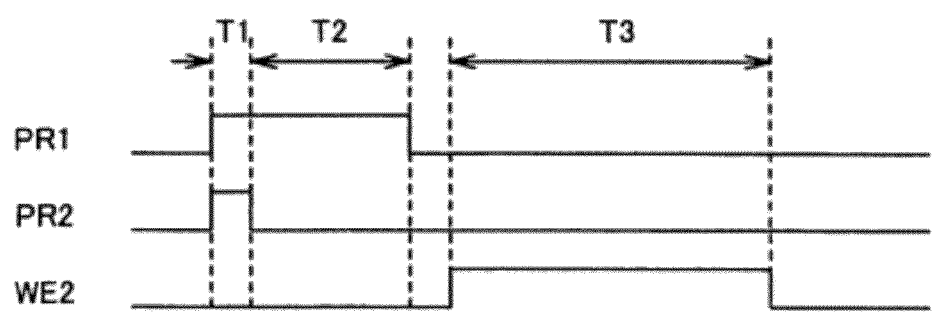
FIG. 32 is an operational timing chart diagram for the ninth embodiment.

In this embodiment, a sense amplifier shown in FIG. 31 will be described. As shown in FIG. 31, this embodiment is different from the eighth embodiment in that, in the circuit diagram shown in FIG. 30, a sixth switch SW6 and a seventh switch SW7 are added to the drains of the PMOS transistors MP1 and MP2, respectively, for controlling the connection with the power source GND. The ON/OFF of the sixth switch SW6 and the seventh switch SW7 is controlled through a control signal PR2. However, the fourth switch SW4 and the fifth switch SW5 are controlled through a control signal WE2. Thus, this embodiment is different from the seventh embodiment and the eighth embodiment. The use of the control signal PR1 is the same as those cases of the seventh embodiment and the second embodiment. Operational timing including the control signals PR2 and WE2 is shown in FIG. 32.

The conductive type of the transistor is fixed in the first to ninth embodiments for the descriptive purpose. However, the conductive type of the transistor can be inverted by inverting the level of the power source system.

EXAMPLES

Here, examples of the present invention will be described with reference to drawings.

First Example

Figure 10:
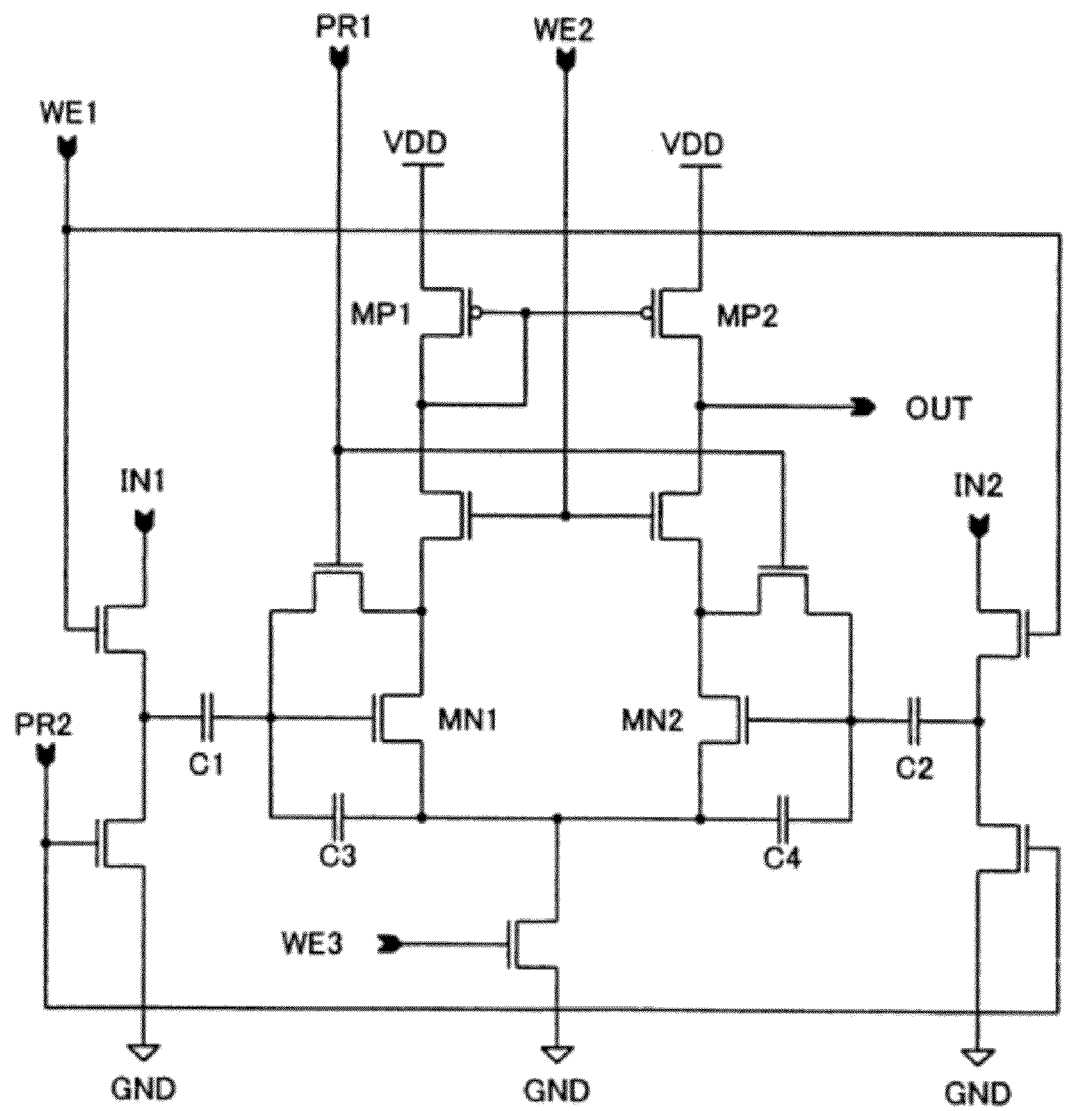
FIG. 10 is a circuit diagram of a first example of the present invention.

In this example shown in FIG. 10, each switch in the sense amplifier (FIG. 1) according to the first embodiment is specifically constructed by using an NMOS transistor. While an NMOS transistor is used for each switch in this example, a PMOS transistor or a CMOS transistor may be used. Alternatively, an NMOS, a PMOS and a CMOS may be used in combination.

While, in this example, each switch of the sense amplifier (FIG. 1) according to the first embodiment is constructed by using an NMOS transistor, the switches for the sense amplifiers in the second to sixth embodiments can be naturally constructed by using an NMOS transistor. Alternatively, an NMOS, a PMOS and a CMOS may be used as each of the switches in combination freely.

Second Example

Figure 33:
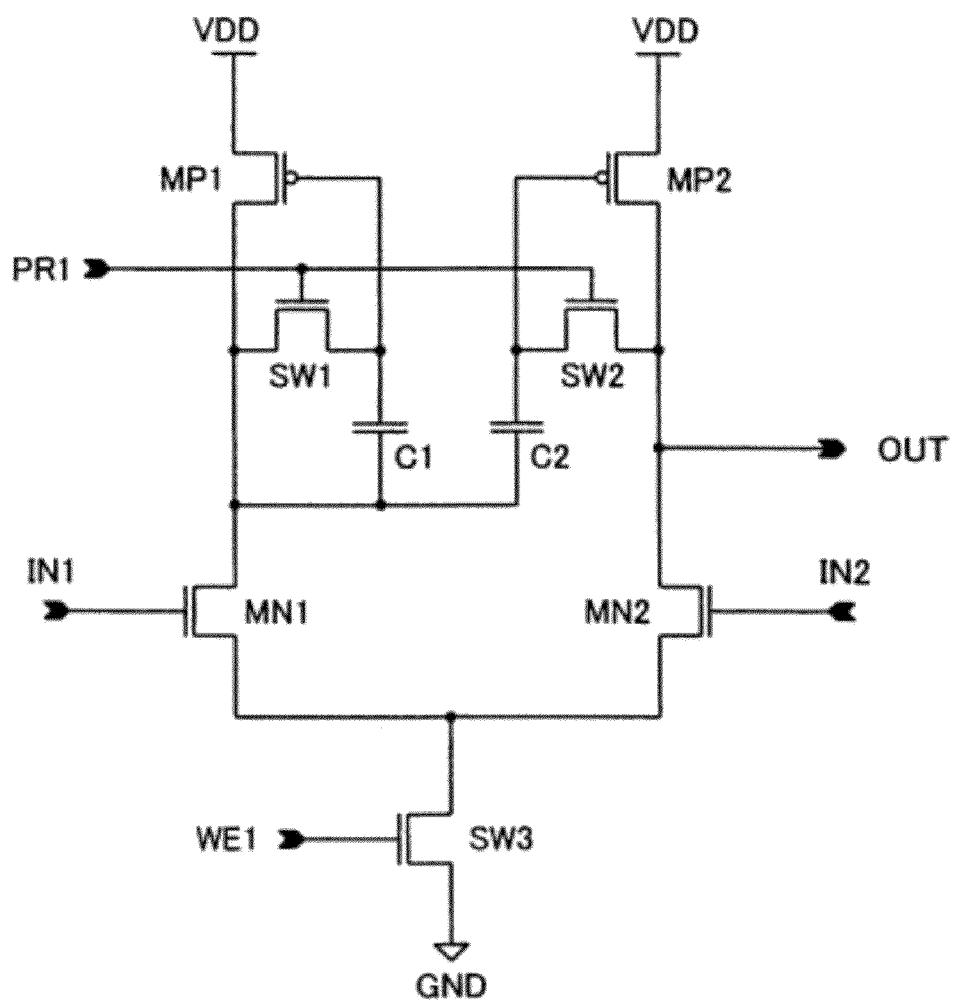
FIG. 33 is a circuit diagram of the second example of the present invention.

In this example shown in FIG. 33, each switch in the sense amplifier (FIG. 27) according to the seventh embodiment is specifically constructed by using an NMOS transistor. While an NMOS transistor is used for each switch in this example, a PMOS transistor or a CMOS transistor may be used. Alternatively, an NMOS, a PMOS and a CMOS may be used in combination.

While, in this example, each switch of the sense amplifier (FIG. 27) according to the seventh embodiment is constructed by using an NMOS transistor, each of the switches for the sense amplifiers in the eighth and ninth embodiments can be naturally constructed by using an NMOS transistor. Alternatively, an NMOS, a PMOS and a CMOS may be used as each of the switches in combination freely.

Third Example

Figure 11:
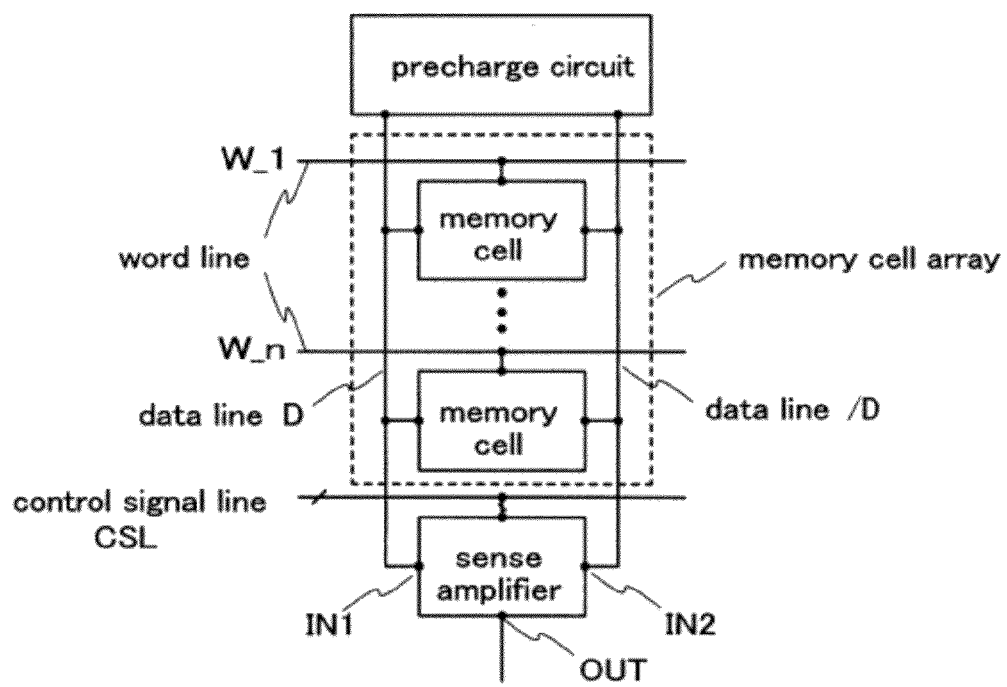
FIG. 11 is a circuit diagram of a second example of the present invention.

FIG. 11 shows a part of a semiconductor memory apparatus including memory cells for one column. In this example, the sense amplifier described in the first to ninth embodiments is embedded in the semiconductor memory apparatus. This example includes a precharge circuit, a memory cell array including memory cells, a pair of data lines D and /D, word lines (W_1, W_2, . . . , and W_n), a multiple control signal lines CSL, and a sense amplifier.

An operation for reading data will be described briefly. First of all, the pair of data lines D and /D is caused to have a same potential by the precharge circuit. Next, one of the word lines takes an active potential and the corresponding memory cell is selected. When the memory cell is selected, a potential difference occurs between the pair of data lines D and /D depending on stored data. The potential difference is detected by the sense amplifier, and data is read out. In this way, the sense amplifier according to the first to ninth embodiment can be used in a semiconductor memory apparatus.

Fourth Example

Figure 12:
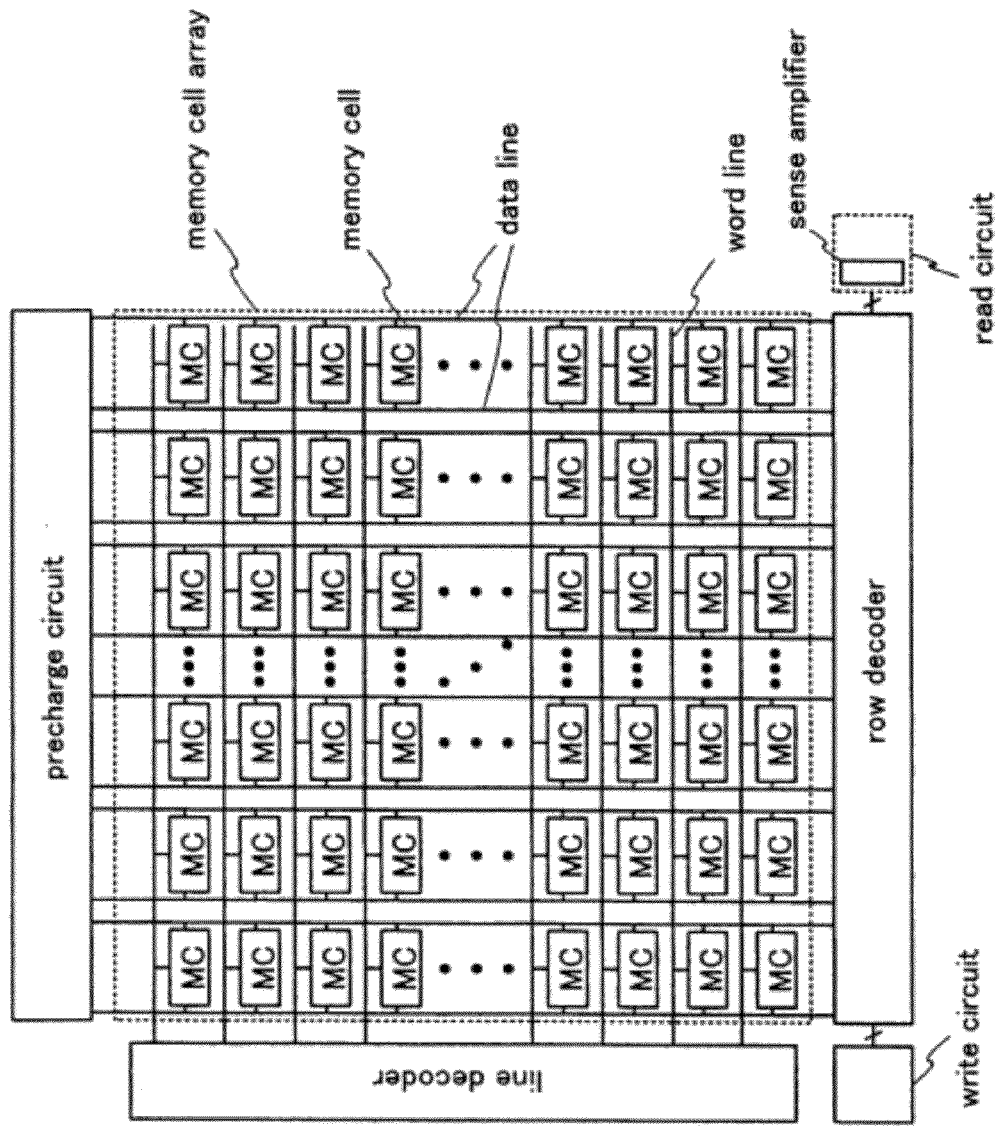
FIG. 12 is a circuit diagram of a third example of the present invention.

FIG. 12 is a block diagram of a semiconductor memory apparatus including memory cells arranged in matrix according to this example. FIG. 12 shows another example where the sense amplifier according to the first to ninth embodiments is embedded in a semiconductor memory apparatus. This example includes a precharge circuit, a memory cell array including memory cells, a pair of data lines, word lines, a write circuit and a read circuit. The sense amplifier according to the first to sixth embodiments is included in the read circuit.

An operation for reading data in this example will be described briefly. First of all, the pair of data lines is caused to have a same potential by the precharge circuit. Next, by using a line decoder, one of the word lines takes an active potential and the corresponding memory cell row is selected. Thus, a potential difference occurs in the pair of data lines depending on data stored in memory cells in the selected memory cell row. Furthermore, one of the pair of data lines is selected by using a column decoder. Then, the selected data line is detected by the sense amplifier in the read circuit, and data is read out. Thus, data in a desired memory cell is read out. In this way, the sense amplifier according to the first to ninth embodiment can be used in a semiconductor memory apparatus. The second example corresponds to the part extracted from this example.

Fifth Example

Figure 13:
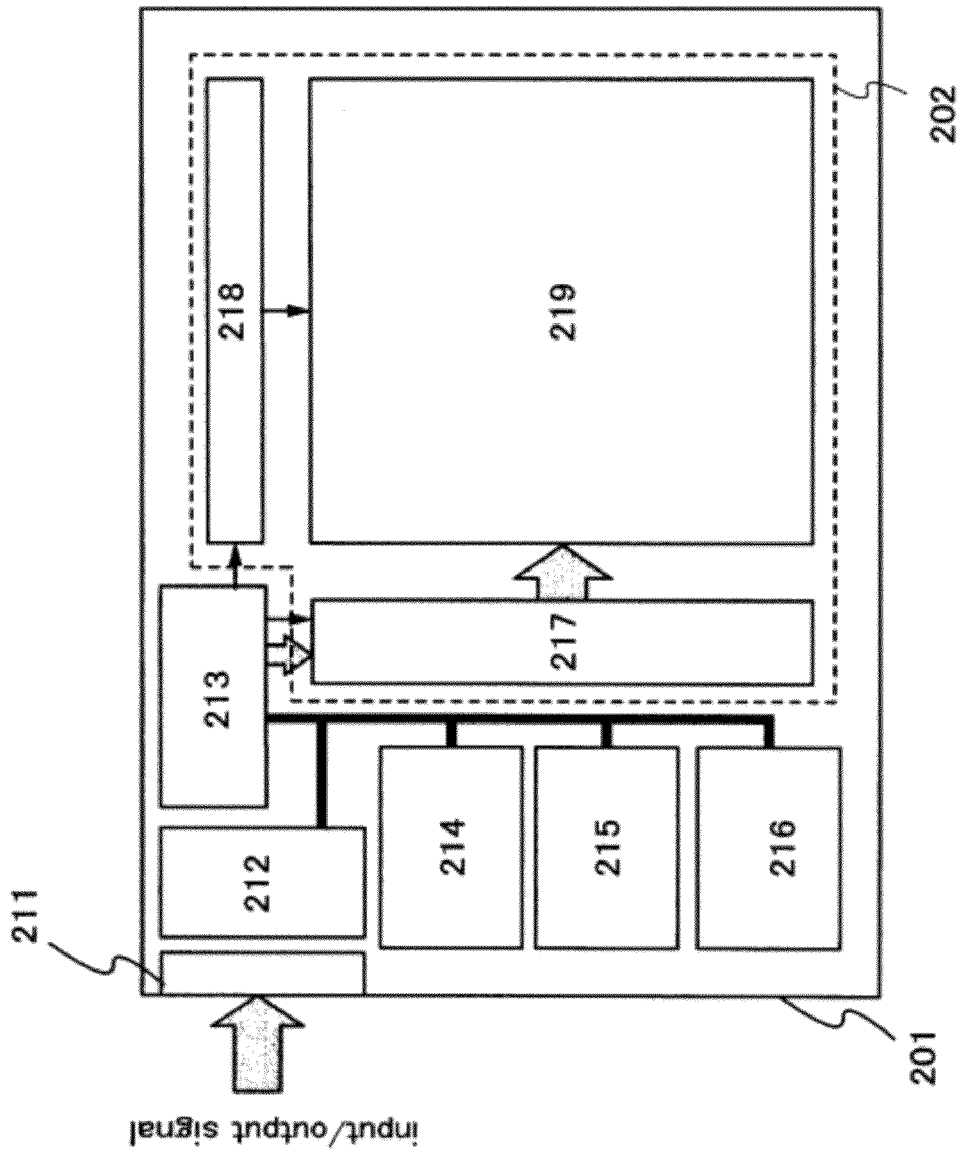
FIG. 13 is a circuit diagram of a fourth example of the present invention.

FIG. 13 is a block diagram of a semiconductor device including a system and a display and shows another example where the sense amplifier according to the first to ninth embodiments is embedded in the semiconductor device.

In FIG. 13, a semiconductor device 201 captures or creates image data, processes and converts the format of the image data, and displays the image. The semiconductor device 201 may be a game machine, a video camera, a car navigation system, and a personal computer.

The semiconductor device 201 has an input terminal 211, a first control circuit 212, a second control circuit 213, a CPU 214, a first memory circuit 215 and a second memory circuit 216, and a semiconductor display 202 including a signal line drive circuit 217, a scan line drive circuit 218 and a pixel portion 219. Conventionally, only the semiconductor display 202 is provided on a substrate having an insulating surface of, for example, glass, quartz, or plastic. In this example, all of circuit blocks are provided on the substrate having the insulating surface.

Data, which is a basis of image data, is input from the input terminal 211 in accordance with each electronic apparatus.

For example, data may be input from an antenna in a broadcasting receiving machine. Data may be input from a CCD in a video camera. Data may be input from a DV tape or a memory card. The data input from the input terminal 211 is converted to image signals by the first control circuit 212. In the first control circuit 212, the image data compressed and encoded in accordance with MPEG standard and/or the tape format undergoes image signal processing such as decoding processing and image interposing and resizing. The image signal output from the first control circuit 212 and/or the image signal generated or processed by the CPU 214 are input to the second control circuit 213. Then, the image signals are converted to a format suitable to the semiconductor display 202 (such as scanning format). The format-converted image signal and a control signal are output from the second control circuit 213.

The CPU 214 efficiently controls signal processing in the first control circuit 212, the second control circuit 213 and another interface circuit. In addition, the CPU 214 creates and/or processes image data. The first memory circuit 215 may be used as a memory area for storing image data output from the first control circuit 212 and image data output from the second control circuit 213, a work memory area used for control by the CPU 214, and a work memory area used for creating image data by the CPU 214. The first memory circuit 215 may be a DRAM or an SRAM. The sense amplifier according to the first to sixth embodiments is used in the first memory circuit 215. The second memory circuit 216 is a memory area for storing color data and/or text data required for creating or processing image data by the CPU 214. The second memory circuit 216 is constructed by using a mask ROM or an EPROM.

The signal line drive circuit 217 receives an image signal and a control signal (such as a clock signal and a start pulse) from the second control circuit 213. The scan line drive circuit 218 receives a control signal (such as a clock signal and a start pulse) from the second control circuit 213. An image is displayed in the pixel portion 219.

The semiconductor display may be a liquid crystal display or an EL display. Like the high-performance game machine, when the load on the CPU is too large, the architecture shown in FIG. 13 may include an additional processor for image processing to reduce the load on the CPU.

As describe above, the sense amplifier according to the first to sixth embodiments can be used in a semiconductor device.

Sixth Example

This example shows an example of a method for crystallizing a semiconductor film for producing a semiconductor active layer of a TFT included in a semiconductor device according to the present invention.

As a primary film, silicon nitride oxide film (composition rate: Si=32%, O=59% and N=7%, and H=2%) in 400 nm thick was formed on a glass substrate by plasma CVD method. Then, as a semiconductor film, 150 nm of amorphous silicon film was formed on the primary film by plasma CVD method. Then, thermal processing at 500° C. is performed thereon for three hours so that hydrogen contained in the semiconductor film is discharged. After that, the semiconductor film was crystallized by laser anneal method.

As the laser used for laser anneal method, continuous wave $YVO_4$ laser light was used. For the laser anneal method, the second harmonic (wavelength 532 nm) of the $YVO_4$ laser was used as laser light. As the beam in a predetermined form, laser light was irradiated to the semiconductor film on the substrate surface by using an optical system.

The form of the beam irradiated to the substrate can be varied depending on the type of laser or optical system. In this way, the aspect ratio and/or distribution of energy density of the beam irradiated onto the substrate can be changed. For example, various forms of the beam irradiated onto the substrate are possible such as linear, rectangular and oval forms. In this example, the second harmonic of the $YVO_4$ laser in an oval form of 200 μm×50 μm was irradiated to the semiconductor film by using an optical system.

Figure 14:
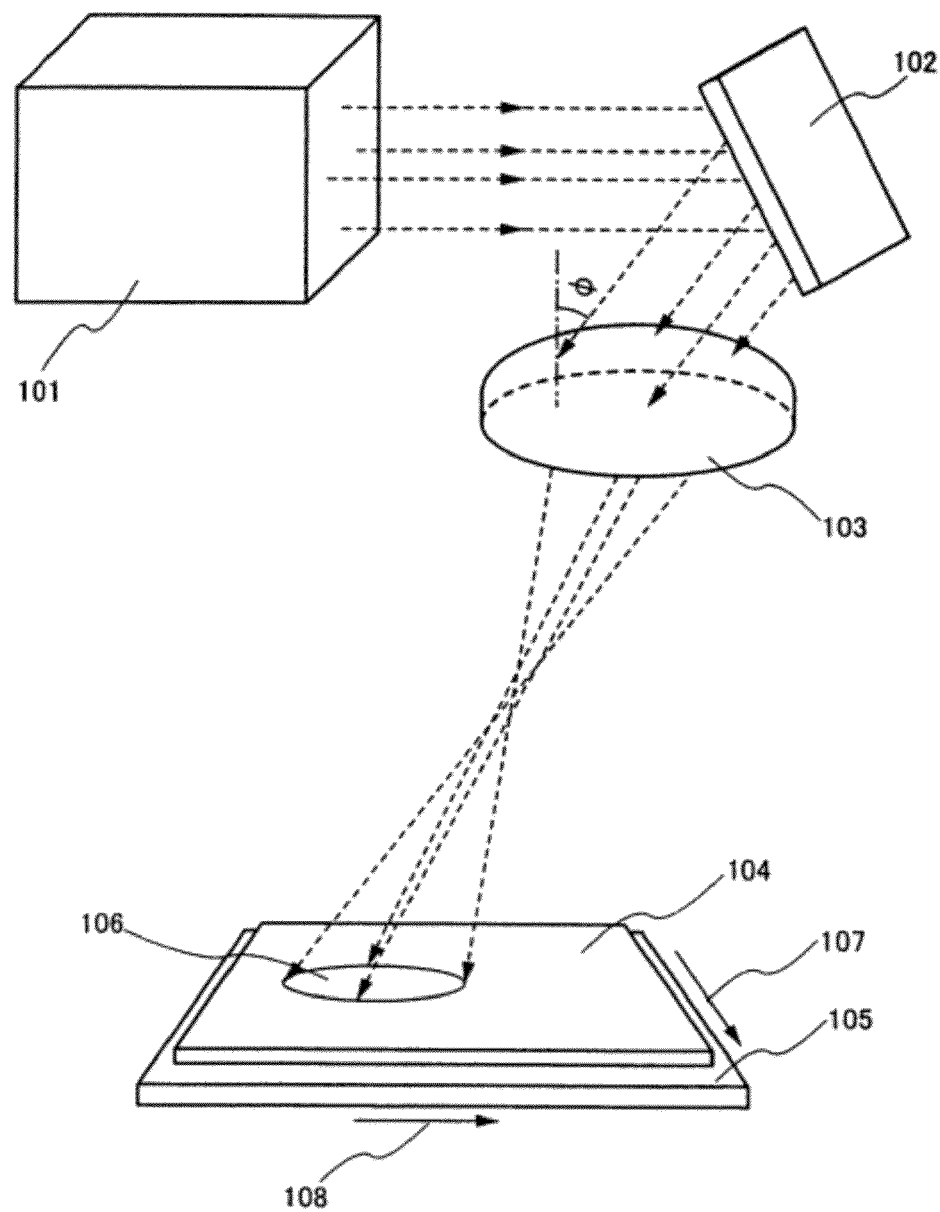
FIG. 14 is a schematic diagram of an optical system used in a fifth example.

FIG. 14 shows a model diagram of an optical system, which is used when laser light is irradiated to a semiconductor film on a substrate surface.

Laser light (the second harmonic of $YVO_4$ laser) emitted from laser 101 enters a convex lens 103 through a mirror 102. The laser light enters to the convex lens 103 diagonally. As a result, a focus position is shifted due to the aberration such as astigmatism. Thus, oval beam 106 can be formed in an irradiated surface or near there.

Then, the oval beam 106 formed in this way was irradiated, and a glass substrate 105 was moved in a direction indicated by a reference numeral 107 or 108. Then, in the semiconductor film 104 formed on the glass substrate 105, the oval beam 106 was irradiated by relatively being moved.

The relative scanning direction of the oval beam 106 is perpendicular to the major axis of the oval beam 106.

In this example, the oval beam of 200 μm×50 μm is formed having incident angle φ of about 20° of laser light with respect to the convex lens 103. The oval beam is irradiated on the glass substrate 105 by being moved at the speed of 50 cm/s. Thus, the semiconductor film is crystallized.

Figure 15:
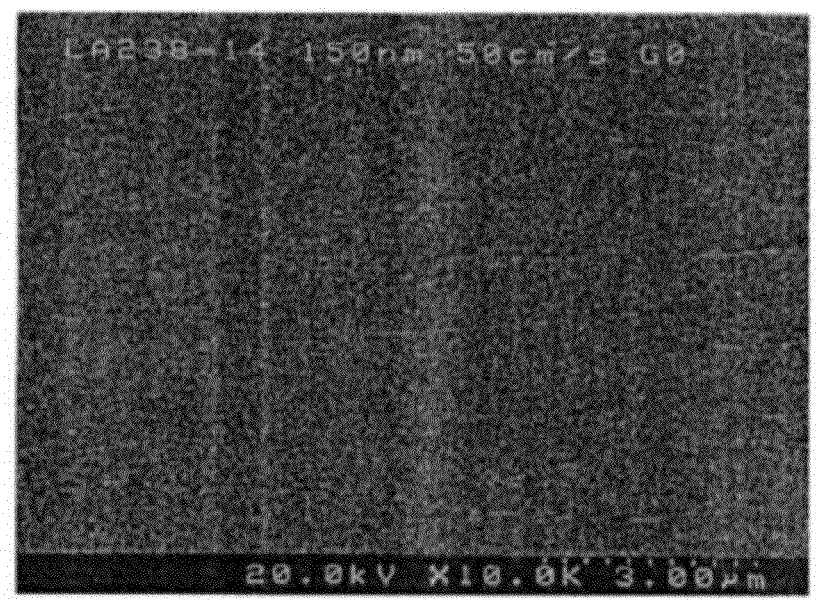
FIG. 15 is an SEM photograph of a crystalline semiconductor film generated in the fifth example.

The Secco etching is performed on the crystalline semiconductor film obtained in this way. FIG. 15 shows the result of the observation of the surface by using an SEM with 3,000 magnifications. The Secco solution used for the Secco etching is produced by adding $K_2Cr_2O_7$ as additive to $HF:H_2O$=2:1. One shown in FIG. 15 is obtained by relatively scanning laser light in a direction indicated by an arrow shown in FIG. 15. Large crystal grains are formed in parallel with the scanning direction of the laser light. In other words, the crystal is raised so as to extend in the scanning direction of the laser light.

In this way, large crystal grains are formed on the crystallized semiconductor film by using the method according to this example. Therefore, when the semiconductor film is used as a semiconductor active layer to produce a TFT, the number of the crystal grain boundaries included in the channel forming area of the TFT can be reduced. In addition, each crystal grain internally has crystallinity, which is essentially single crystal. Therefore, the mobility (field effect mobility) as high as that of a transistor using a single crystal semiconductor can be obtained.

Furthermore, when the TFT is positioned such that the direction that the carrier moves can be the same as the direction that the formed crystal grains extend, the number of times that the carriers cross the crystal grain boundary can be extremely reduced. Therefore, a variation in ON current value (value of drain current flowing when the TFT is ON), an OFF current value (value of drain current flowing when the TFT is OFF), a threshold voltage, an S-value and field effect mobility can be reduced. As a result, the electric characteristic can be improved significantly.

In order to irradiate the oval beam 106 in a wide range of the semiconductor film, the oval beam 106 is scanned in a direction perpendicular to the major axis to irradiate to the semiconductor film multiple times. Here, the position of the oval beam 106 is shifted in the direction parallel to the major axis for every single scan. The scanning direction becomes opposite between serial scans. In the serial two scans, one will be called outward scan and the other will be called inward scan hereinafter.

The amount of shifting the position of the oval beam 106 to the direction parallel to the major axis for every single scan is expressed by pitch d. A reference numeral D1 indicates, in the outward scan, the length of the oval beam 106 in the direction perpendicular to the scanning direction of the oval beam 106 in an area having large crystal grains as shown in FIG. 15. A reference numeral D2 indicates, in the inward scan, the length of the oval beam 106 in the direction perpendicular to the scanning direction of the oval beam 106 in an area having large crystal grains as shown in FIG. 15. In this case, a mean value of D1 and D2 is D.

Here, an overlap ratio $R_{OL}$ [%] is defined by Equation 1.

$$R_{OL}=(1-d/D)\times 100 \qquad \text{Equation 1}$$

In this example, the overlap ratio $R_{OL}$ was 0%.

Seventh Example

This example is different from the sixth example in the method for crystallizing a semiconductor film when a semiconductor active layer of a TFT included in the semiconductor device according to the present invention is produced.

The steps up to forming an amorphous silicon film as a semiconductor film are the same as those of the sixth example. After that, the method disclosed in JP-A-7-183540 was used. Nickel acetate solution (weight-reduced density 5 ppm and volume 10 ml) was coated on the semiconductor film by spin-coat method. Then, thermal processing was performed thereon in a nitrogen atmosphere at 500° C. for one hour and in a nitrogen atmosphere at 550° C. for twelve hours. Then, the crystallinity of the semiconductor film was improved by laser anneal method.

As the laser used for laser anneal method, continuous wave $YVO_4$ laser light was used. For the laser anneal method, the second harmonic (wavelength 532 nm) of the $YVO_4$ laser was used as laser light. The oval beam of 200 μm×50 μm is formed having incident angle φ of about 20° of laser light with respect to the convex lens 103 in the optical system shown in FIG. 14. The oval beam was moved and irradiated to the glass substrate 105 at the speed of 50 cm/s. Thus, the crystallinity of the semiconductor film was improved.

The relative scanning direction of the oval beam 106 was perpendicular to the major axis of the oval beam 106.

Figure 16:
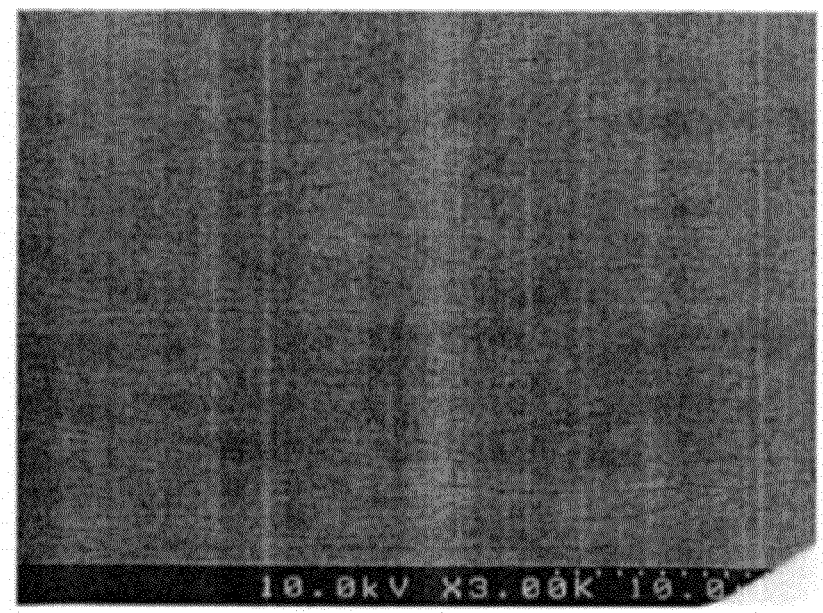
FIG. 16 is an SEM photograph of a crystalline semiconductor film generated in a sixth example.

The Secco etching is performed on the crystalline semiconductor film obtained in this way. FIG. 16 shows the result of the observation of the surface by using an SEM with 3,000 magnifications. One shown in FIG. 16 is obtained by relatively scanning laser light in a direction indicated by an arrow shown in FIG. 16. Large crystal grains extend in the scanning direction.

In this way, large crystal grains are formed on the crystallized semiconductor film according to the present invention. Therefore, when the semiconductor film is used to produce a TFT, the number of the crystal grain boundaries included in the channel forming area of the TFT can be reduced. In addition, each crystal grain internally has crystallinity, which is essentially single crystal. Therefore, the mobility (field effect mobility) as high as that of a transistor using a single crystal semiconductor can be obtained.

Furthermore, The formed crystal grains are aligned in one direction. Thus, when the TFT is positioned such that the direction that the carriers move can be the same as the direction that the formed crystal grains extend, the number of times that the carriers cross the crystal grain boundary can be extremely reduced. Therefore, a variation in ON current value (value of drain current flowing when the TFT is ON), an OFF current value (value of drain current flowing when the TFT is OFF), a threshold voltage, an S-value and field effect mobility can be reduced. As a result, the electric characteristic can be improved significantly.

In order to irradiate the oval beam 106 in a wide range of the semiconductor film, the oval beam 106 is scanned in a direction perpendicular to the major axis to irradiate to the semiconductor film multiple times (this operation may be called scan). Here, the position of the oval beam 106 is shifted in the direction parallel to the major axis for every single scan. The scanning direction becomes opposite between serial scans. In the serial two scans, one will be called outward scan and the other will be called inward scan hereinafter.

The amount of shifting the position of the oval beam 106 to the direction parallel to the major axis for every single scan is expressed by pitch d. A reference numeral D1 indicates, in the outward scan, the length of the oval beam 106 in the direction perpendicular to the scanning direction of the oval beam 106 in an area having large crystal grains as shown in FIG. 16. A reference numeral D2 indicates, in the inward scan, the length of the oval beam 106 in the direction perpendicular to the scanning direction of the oval beam 106 in an area having large crystal grains as shown in FIG. 16. In this case, a mean value of D1 and D2 is D.

Here, an overlap ratio $R_{OL}$ [%] is defined like Equation 1. In this example, the overlap ratio $R_{OL}$ was 0%.

Figure 17:
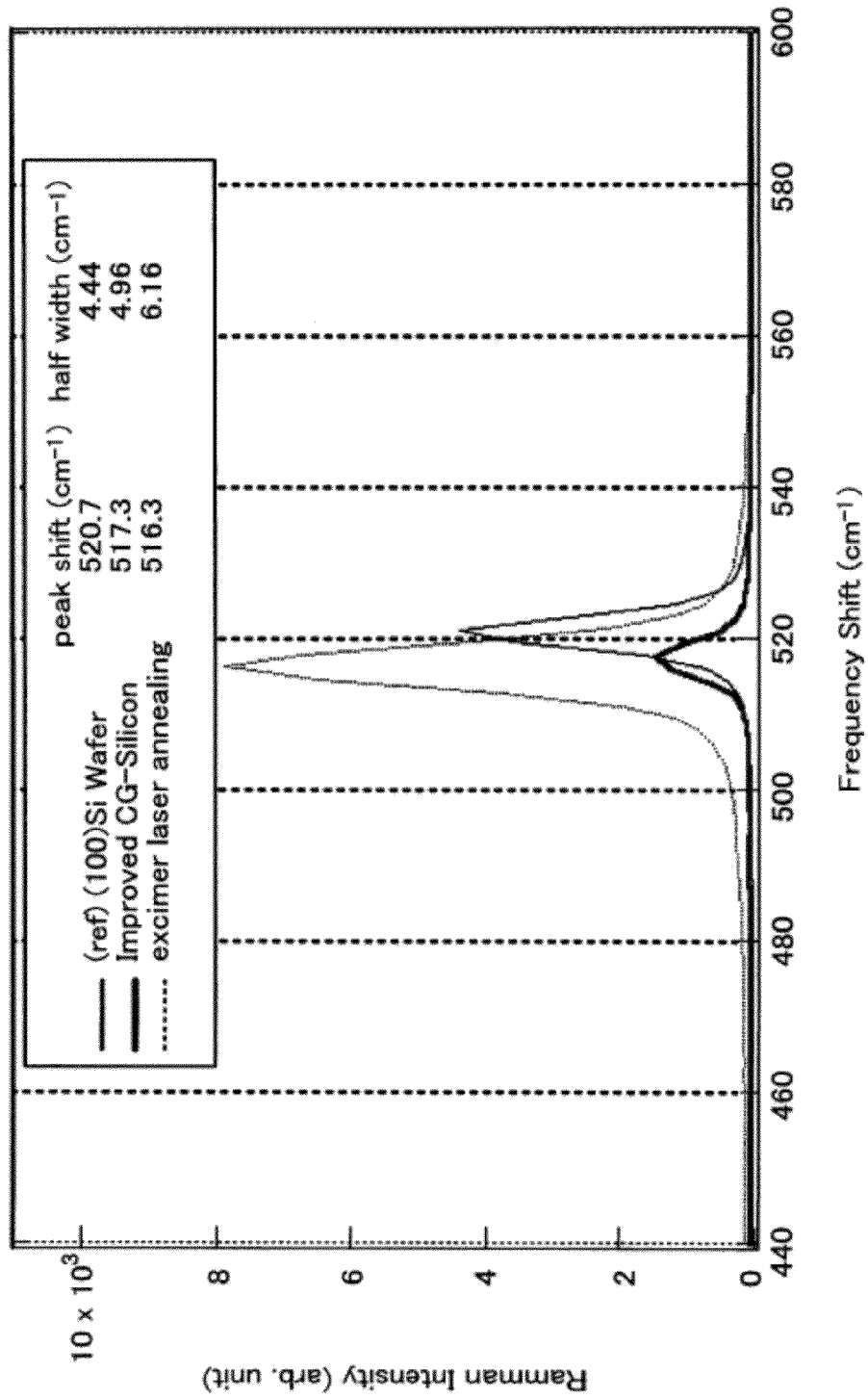
FIG. 17 shows a result of Raman spectroscopy performed on the crystalline semiconductor film generated in the sixth example.

In FIG. 17, a thick line indicates a result of Raman spectroscopy performed on the crystalline semiconductor film (represented by improved CG-Silicon in FIG. 17) obtained by using the above-described crystallizing method. Here, for comparison, a thin line indicates a result of Raman spectroscopy performed on the single crystal silicon (represented by ref. (100) Si Wafer in FIG. 17). In FIG. 17, a dotted line indicates a result of Raman spectroscopy performed on a semiconductor film (represented by excimer laser annealing in FIG. 17). In order to obtain the semiconductor film, an amorphous silicon film is formed and hydrogen contained in the semiconductor film was discharged through thermal processing. Then, the semiconductor film was crystallized by using excimer laser with pulse oscillation.

The Raman shift of the semiconductor film obtained by using the method of this example has the peak at 517.3 $cm^{-1}$. The half value breadth is 4.96 $cm^{-1}$. On the other hand, the Raman shift of the single crystal silicon has the peak at 520.7 $cm^{-1}$. The half value breadth is 4.44 $cm^{-1}$. The Raman shift of the semiconductor film crystallized by using the excimer laser with the pulse oscillation has the peak at 516.3 $cm^{-1}$. The half value breadth is 6.16 $cm^{-1}$.

From the results in FIG. 17, the crystallinity of the semiconductor film obtained by using the crystallizing method described in this example is closer to that of the single crystal silicon than the crystallinity of the semiconductor film crystallized by using the excimer laser with pulse oscillation.

Eighth Example

In this example, a case where a semiconductor film crystallized by using the method described in the sixth example is used to produce a TFT will be described with reference to FIGS. 14, 18A to 18H and 19A and 19B.

Figure 18A:
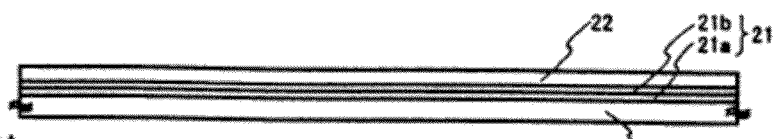
FIGS. 18A to 18H show a process diagram of TFT production in a seventh to example.
Figure 18B:

A glass substrate was used as a substrate 20 in this example. As a primary film 21, 50 nm of silicon oxide nitride film (composition rate Si=32%, O=27%, N=24%, and H=17%) and 100 nm of silicon oxide nitride film (composition rate Si=32%, O=59%, N=7%, and H=2%) were stacked on the glass substrate. Next, as a semiconductor film 22, 150 nm of amorphous silicon film was formed on the primary film 21 by plasma CVD method. Then, thermal processing was performed thereon at 500° C. for three hours to discharge hydrogen contained in the semiconductor film (FIG. 18A).

After that, the second harmonic (wavelength 532 nm, 5.5 W) of the continuous wave $YVO_4$ laser light was used as the laser light to form an oval beam of 200 μm×50 μm having incident angle φ of about 20° of laser light with respect to the convex lens 103 in the optical system shown in FIG. 14. The oval beam is irradiated on the semiconductor film 22 by relatively being scanned at the speed of 50 cm/s. Thus, the semiconductor film 23 is crystallized (18B).

Figure 18C:
Figure 18D:
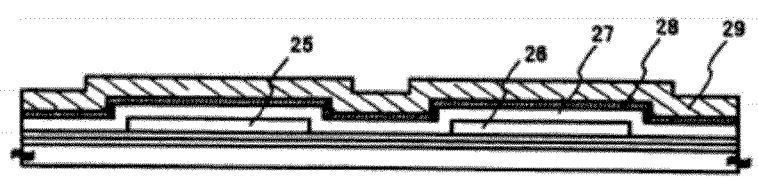

Then, first doping processing was performed thereon, and a semiconductor film 24 was obtained. This is channel doping for controlling the threshold value. $B_2H_6$ was used as material gas having a gas flow amount of 30 sccm, a current density of 0.05 μA, an accelerating voltage of 60 keV, and a dose amount of $1\times10^{14}/cm^2$ (FIG. 18C). Next, after etching the semiconductor film 24 into a desired form by patterning, a silicon oxide nitride film in 115 nm thick was formed by plasma CVD method as a gate insulating film 27 covering the etched semiconductor films 25 and 26. Then, a TaN film 28 in 30 nm thick and a W film 29 in 370 nm thick were stacked on the gate insulating film 27 as a conductive layer (FIG. 18D).

A mask (not shown) of resist was formed thereon by using photolithography method, and the W film, the TaN film and the gate insulating film were etched.

Figure 18E:
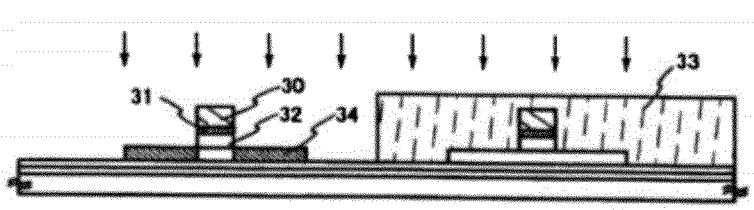

Then, the mask of resist was removed, and a new mask 33 is formed. The second doping processing was performed thereon and an impurity element adding the n-type to the semiconductor film was introduced. In this case, the conductive layers 30 and 31 are masks for the impurity element supplying the n-type, and an impurity region 34 was formed in a self-aligned manner. In this example, the second doping processing was performed under two conditions because the semiconductor film was thick as much as 150 nm. In this example, phosfin ($PH_3$) was used as material gas. The dose amount of $2\times10^{13}/cm^2$ and the accelerating voltage of 90 keV were used, and then the dose amount of $5\times10^{14}/cm^2$ and the accelerating voltage of 10 keV were used for the processing (FIG. 18E).

Figure 18F:
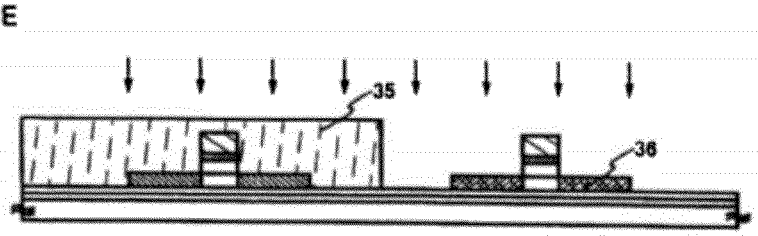

Next, the mask 33 of resist was removed, and a mask 35 of resist was formed additionally for performing the third doping processing. Through the third doping processing, an impurity region 36 was formed containing an impurity element for supplying the opposite conductive type against the one conductive type to the semiconductor film, which is an active layer of a p-channel type TFT. By using the conductive layers 30 and 31 as a mask for the impurity element, the impurity region 36 was formed in the self-aligned manner by addition of the impurity element for supplying the p-type. Also the third doping processing in this example was performed under two conditions because the semiconductor film was thick as much as 150 nm. In this example, diborane ($B_2H_6$) was used as material gas. The dose amount of $2\times10^{13}/cm^2$ and the accelerating voltage of 90 keV were used, and then the dose amount of $1\times10^{15}/cm^2$ and the accelerating voltage of 10 keV were used for the processing (FIG. 18F).

Through these steps, the impurity regions 34 and 36 were formed on the semiconductor layer.

Next, the mask 35 of resist was removed, and silicon oxide nitride film (composition rate Si=32.8%, O=63.7%, and N=3.5%) in 50 nm thick was formed as a first interlayer insulating film 37 by plasma CVD method.

Figure 18G:
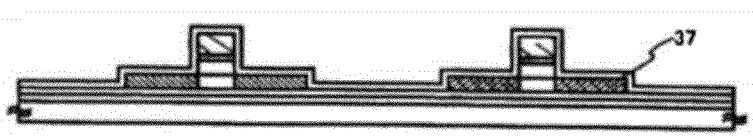

Next, thermal processing was performed thereon to recover crystallinity of the semiconductor layers and to activate the impurity elements added to the semiconductor layers, respectively. Then, thermal processing by thermal annealing method using an anneal furnace was performed at 550° C. for four hours in a nitrogen atmosphere (FIG. 18G).

Next, a second interlayer insulating film 38 of an inorganic or organic insulating material was formed on the first interlayer insulating film 37. In this example, after forming a silicon nitride film in 50 nm thick by CVD method, a silicon oxide film in 400 nm thick was formed.

After the thermal processing, hydride processing can be performed. In this example, the thermal processing was performed at 410° C. for one hour in a nitrogen atmosphere by using an anneal furnace.

Figure 18H:
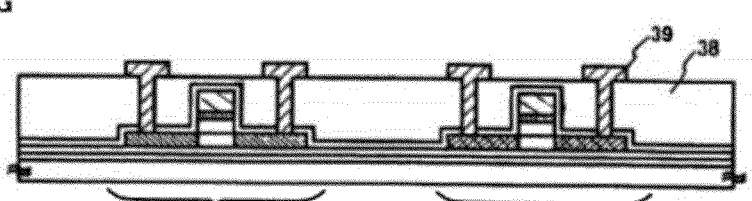

Next, a wire 39 was formed for connecting to the impurity regions electrically. In this example, the wire 39 was formed by patterning a laminate film of a Ti film in 50 nm thick, an Al—Si film in 500 nm thick and a Ti film in 50 nm thick. Naturally, the construction is not limited to the two-layer construction, but may be a single layer construction or a laminate construction having three or more layers. The material of the wire is not limited to Al and Ti. For example, Al and/or Cu may be formed on a TaN film. Then, a laminate film having a Ti film may be patterned to form a wire (FIG. 18H).

In this way, the n-channel TFT 51 and the p-channel type TFT 52 were formed, both having the channel length of 6 μm and the channel width of 4 μm.

Figure 19A:
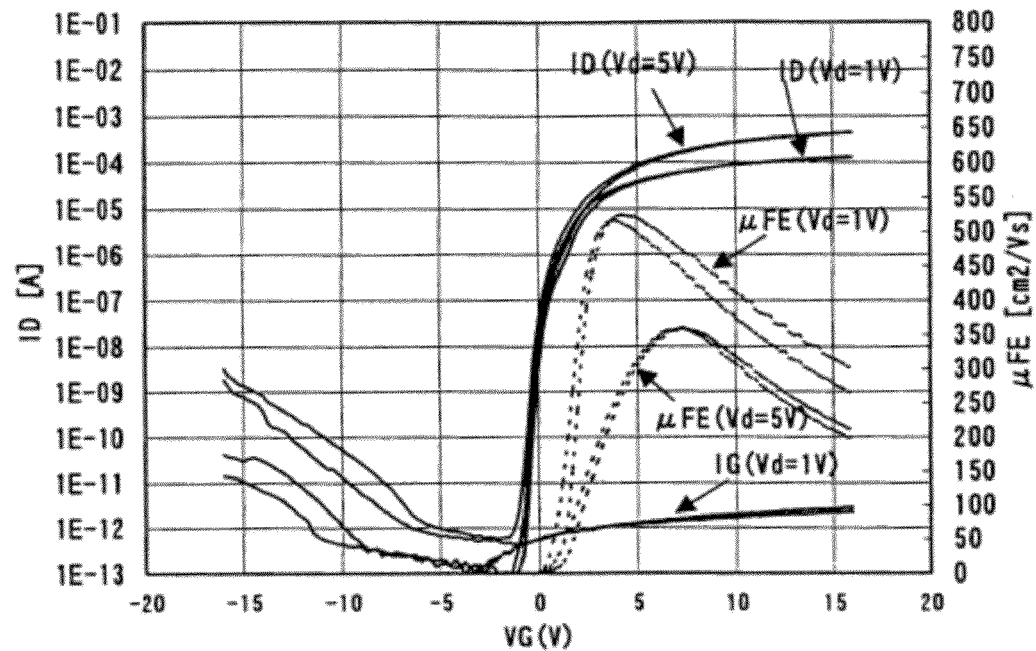
FIGS. 19A and 19B are electric characteristic results of the TFT produced in the seventh example.
Figure 19B:
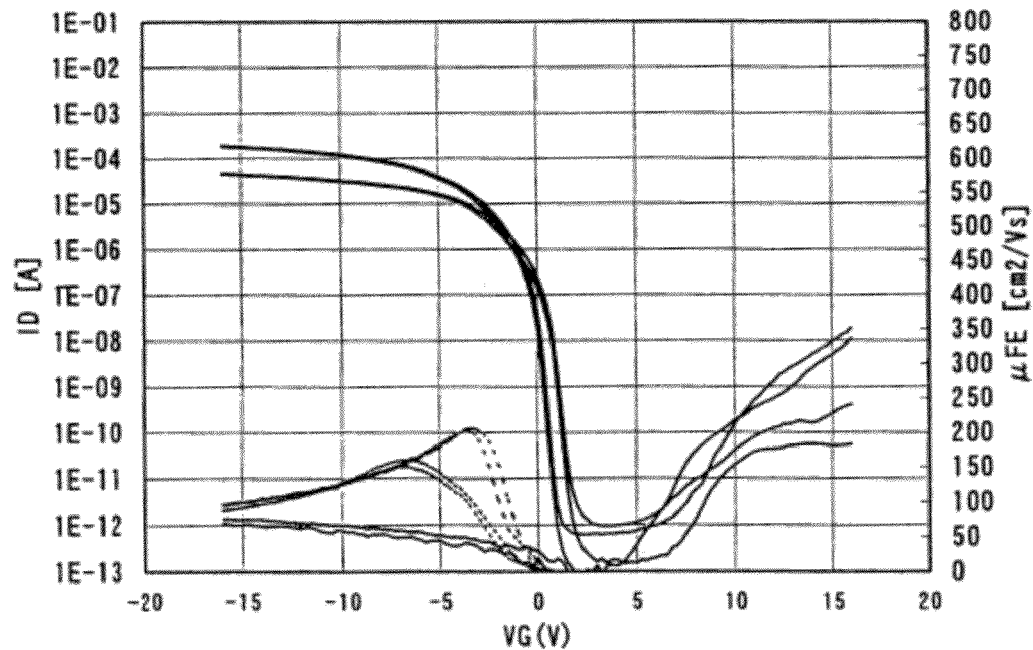

FIGS. 19A and 19B show results of measuring these electrical characteristics. FIG. 19A shows an electric characteristic of the n-channel type TFT 51. FIG. 19B shows an electric characteristic of the p-channel type TFT 52. The electric characteristics were measured at two measurement points in a range of gate voltage Vg=−16 to 16 V and in the range of drain voltage Vd=1 V and 5 V. In FIGS. 19A and 19B, the drain current (ID) and the gate current (IG) are indicated by solid lines. The mobility (μFE) is indicated by a dotted line.

Because large crystal grains are formed on the semiconductor film crystallized according to the present invention, the number of crystal grain boundaries containing the channel forming region can be reduced when a TFT is produced by using the semiconductor film. Furthermore, because the formed crystal grains direct to the same direction, the number of times of crossing the crystal grain boundaries by carriers can be extremely reduced. Therefore, a TFT having the good electric characteristic can be obtained as shown in FIGS. 19A and 19B. Especially, the mobility was 524 $cm^2/Vs$ in the n-channel type TFT and 205 $cm^2/Vs$ in the p-channel type TFT. When a semiconductor device is produced by using this type of TFT, the operational characteristic and the reliability can be improved also.

In this example, the case of the top gate construction has been described. However, a bottom gate construction or a dual gate construction may be used. The substrate may have an insulating surface in general, such as a glass substrate, a quartz substrate and a plastic substrate.

Ninth Example

In this example, a case where a TFT is produced by using a semiconductor film crystallized by using the method described in the seventh example will be described with reference to FIG. 14 and FIGS. 20A to 23B.

Figure 20A:
FIGS. 20A to 20C are process diagrams of TFT production in an eighth example.

The steps up to forming the amorphous silicon film as the semiconductor film were the same as the eighth example. The amorphous silicon film was formed in 150 nm thick (FIG. 20A).

Figure 20B:

After that, the method disclosed in the JP-A-7-183540 was used. Nickel acetate solution (weight-reduced density 5 ppm and volume 10 ml) was coated on the semiconductor film by spin-coat method to form a metal containing layer 41. Then, thermal processing was performed thereon in a nitrogen atmosphere at 500° C. for one hour and in a nitrogen atmosphere at 550° C. for twelve hours. Then, a semiconductor film 42 was obtained (FIG. 20B).

Then, the crystallinity of the semiconductor film 42 was improved by laser anneal method.

As the laser used for laser anneal method, continuous wave $YVO_4$ laser light was used. For the condition for the laser anneal method, the second harmonic (wavelength 532 nm, 5.5 W) of the $YVO_4$ laser was used as laser light. The oval beam of 200 μm×50 μm is formed having incident angle φ of about 20° of laser light with respect to the convex lens 103 in the optical system shown in FIG. 14. The oval beam was moved and irradiated to the substrate at the speed of 20 cm/s or 50 cm/s. Thus, the crystallinity of the semiconductor film 42 was improved. As a result, a semiconductor film 43 was obtained (FIG. 20C).

Figure 20C:
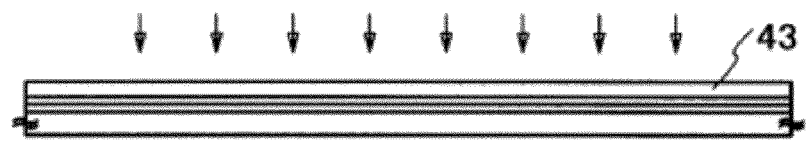

The steps after the crystallizing the semiconductor film in FIG. 20C are the same as the steps shown in FIGS. 18C to 18H shown in the seventh embodiment. In this way, the n-channel type TFT 51 and the p-channel type TFT 52 were formed, both having the channel length of 6 μm and the channel width of 4 μm. These electrical characteristics were measured.

FIGS. 21A to 23B show electric characteristics of the TFT produced through these steps.

Figure 21A:
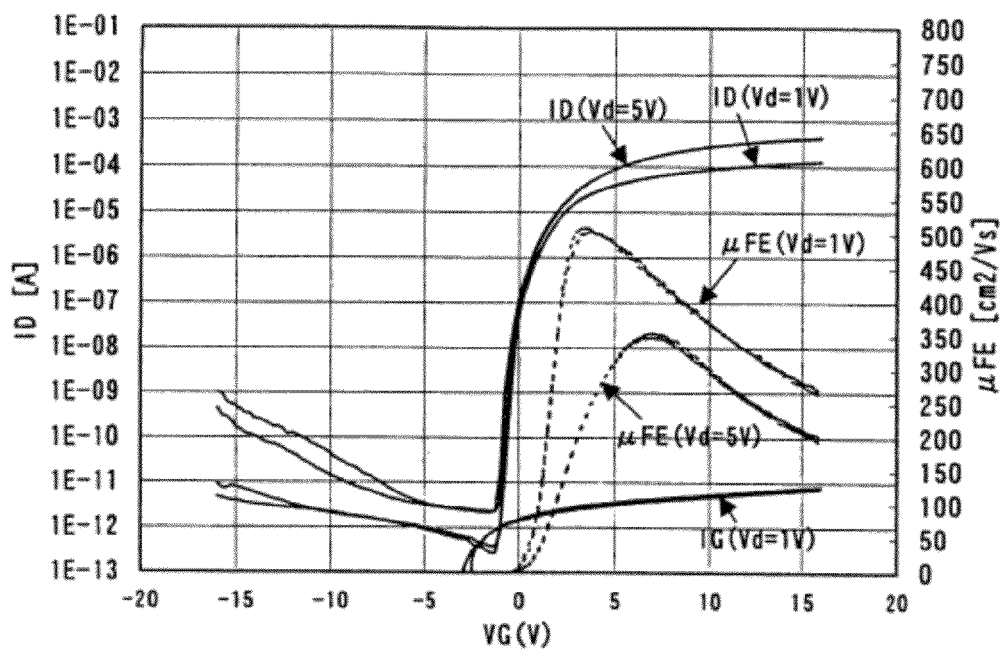
FIGS. 21A and 21B are electric characteristic results of the TFT produced in the eighth example.
Figure 21B:
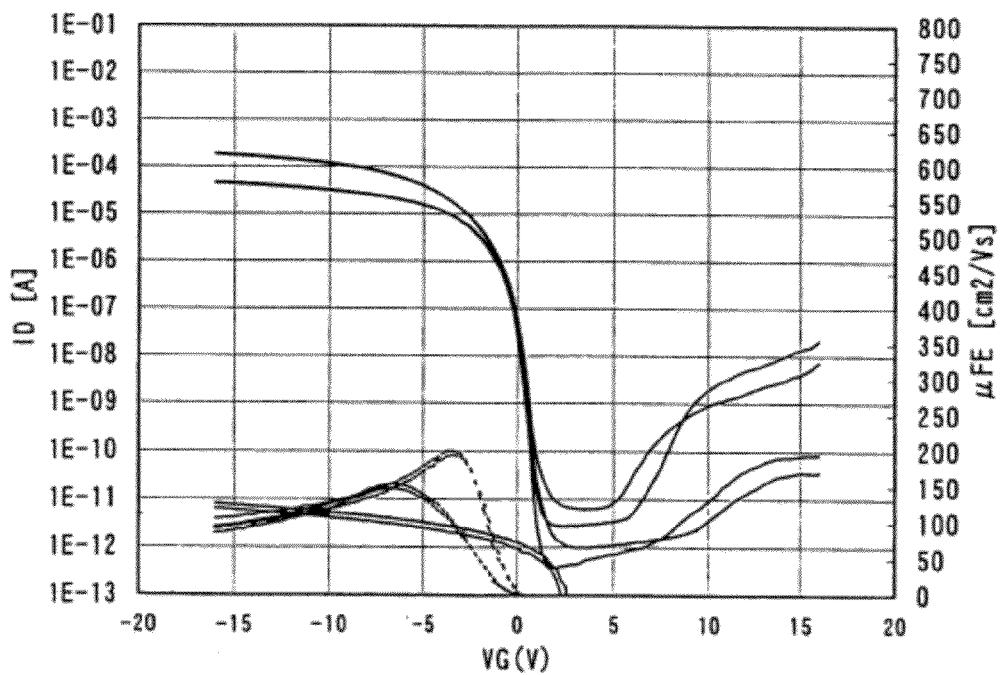
Figure 22A:
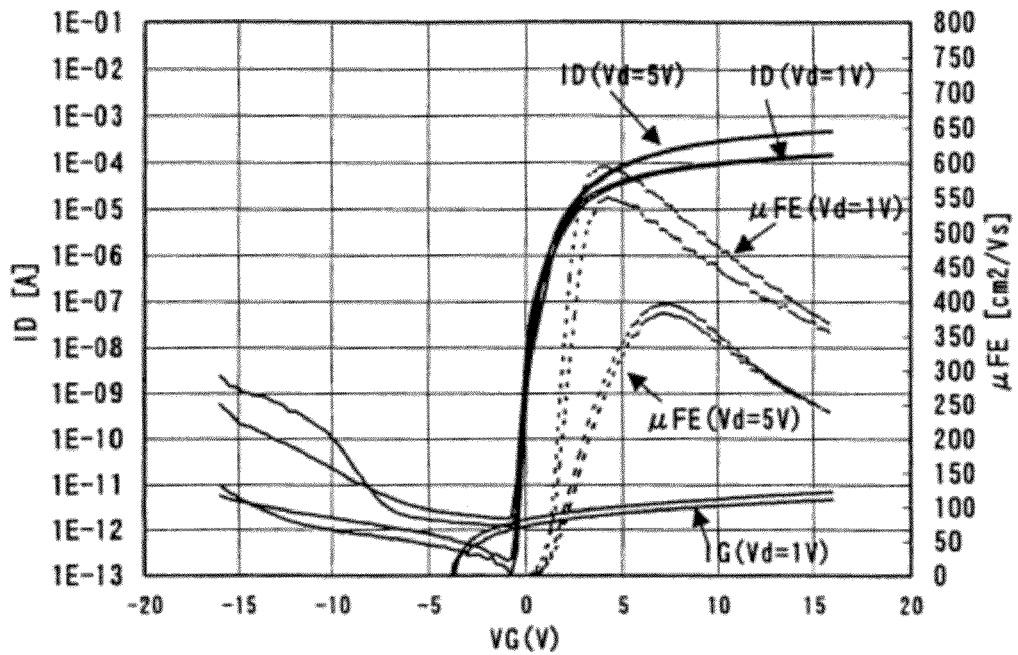
FIGS. 22A and 22B are electric characteristic results of the TFT produced in the eighth example.
Figure 22B:
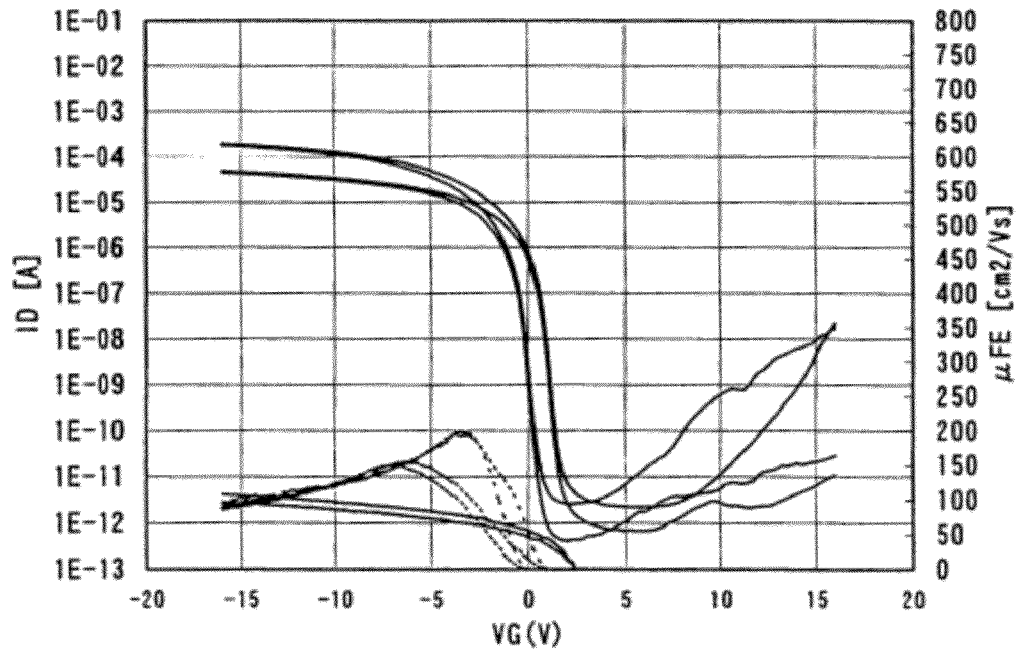

FIGS. 21A and 21B show these electrical characteristics of a TFT produced by moving the substrate at the speed of 20 cm/s in the laser anneal step in FIG. 20C. FIG. 21A shows an electric characteristic of the n-channel type TFT 51. FIG. 21B shows an electric characteristic of the p-channel type TFT 52. FIGS. 22A and 22B show these electrical characteristics of a TFT produced by moving the substrate at the speed of 50 cm/s in the laser anneal step in FIG. 20C. FIG. 22A shows an electric characteristic of the n-channel type TFT 51. FIG. 22B shows an electric characteristic of the p-channel type TFT 52.

The electric characteristics were measured in a range of gate voltage Vg=−16 to 16 V and in the range of drain voltage Vd=1 V and 5 V. In FIGS. 21A to 22B, the drain current (ID) and the gate current (IG) are indicated by solid lines. The mobility (μFE) is indicated by a dotted line.

Because large crystal grains are formed on the semiconductor film crystallized according to the present invention, the number of crystal grain boundaries containing the channel forming region can be reduced when a TFT is produced by using the semiconductor film. Furthermore, the formed crystal grains direct to the same direction. In addition, the small number of grain boundaries is lied in a direction crossing the relative scanning direction of laser light. Therefore, the number of times of crossing the crystal grain boundaries by carriers can be extremely reduced.

Accordingly, a TFT having the good electric characteristic can be obtained as shown in FIGS. 21A to 22B. Especially, the mobility was 510 $cm^2$/Vs in the n-channel type TFT and 200 $cm^2$/Vs in the p-channel type TFT in FIGS. 21A and 21B. The mobility was 595 $cm^2$/Vs in the n-channel type TFT and 199 $cm^2$/Vs in the p-channel type TFT in FIGS. 22A and 22B. When a semiconductor device is produced by using this type of TFT, the operational characteristic and the reliability can be improved also.

Figure 23A:
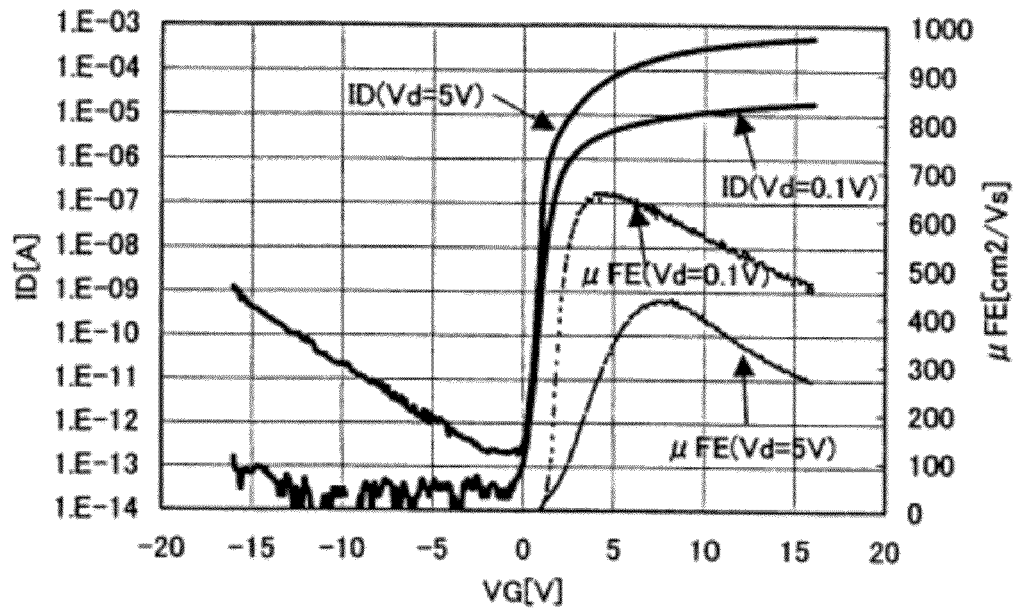
FIGS. 23A and 23B are electric characteristic results of the TFT produced in the eighth example.
Figure 23B:
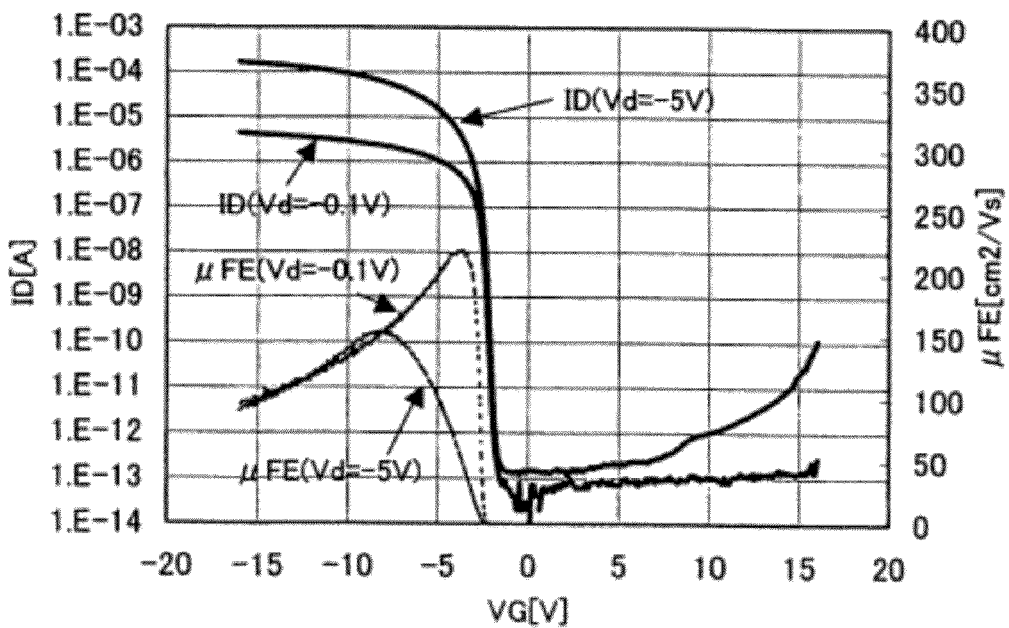

FIGS. 23A and 23B show these electrical characteristics of a TFT produced by moving the substrate at the speed of 50 cm/s in the laser anneal step in FIG. 20C. FIG. 23A shows an electric characteristic of the n-channel type TFT 51. FIG. 23B shows an electric characteristic of the p-channel type TFT 52.

The electric characteristics were measured in a range of gate voltage Vg=−16 to 16 V and in the range of drain voltage Vd=0.1 V and 5 V.

As shown in FIGS. 23A and 23B, a TFT having the good electric characteristic can be obtained. Especially, the mobility was 657 $cm^2$/Vs in the n-channel type TFT in FIG. 23A and 219 $cm^2$/Vs in the p-channel type TFT in FIG. 23B. When a semiconductor device is produced by using this type of TFT, the operational characteristic and the reliability can be improved also.

In this example, the case of the top gate construction has been described. However, a bottom gate construction or a dual gate construction may be used. The substrate may have an insulating surface in general, such as a glass substrate, a quartz substrate and a plastic substrate.

Tenth Example

In this example, the electronic apparatus incorporating a semiconductor device using a sense amplifier of the present invention is described with reference to FIGS. 24A to 24F, and 25A to 25D.

The following can be given as examples of such electronic apparatus: a portable information terminal (such as an electronic book, a mobile computer, or a cellular phone), a video camera; a still camera; a personal computer, a television and the like. Examples of those electronic apparatus are shown in FIGS. 24A to 24F and 25A to 25D.

FIG. 24A shows a cellular phone, which is composed of a main body 9001, a voice outputted portion 9002, a voice inputted portion 9003, a display portion 9004, operation switches 9005, and an antenna 9006. The present invention and the display portion 9004 can be combined and formed on a same substrate.

FIG. 24B shows a video camera, which is composed of a main body 9101, a display portion 9102, an audio inputted portion 9103, operation switches 9104, a battery 9105, and an image receiving portion 9106. The present invention and the display portion 9102 can be combined and formed on a same substrate.

FIG. 24C shows a mobile computer or a portable information terminal, which is composed of a main body 9201, a camera portion 9202, an image receiving portion 9203, operation switches 9204, and a display portion 9205. The present invention and the display portion 9205 can be combined and formed on a same substrate.

FIG. 24D shows a head mounted display, which is composed of a main body 9301, a display portion 9302 and an arm portion 9303. The present invention and the display portion 9302 can be combined and formed on a same substrate.

FIG. 24E shows a television, which is composed of a main body 9401, a speaker 9402, a display portion 9403, a receiving device 9404, an amplifier device 9405 and the like. The present invention and the display portion 9403 can be combined and formed on a same substrate.

FIG. 24F shows a portable electronic book, which is composed of a main body 9501, display portion 9502, a memory medium 9504, an operation switch 9505 and an antenna 9506, and the portable electronic book displays a data recorded in mini disc (MD) and DVD (Digital Versatile Disc) and a data received by an antenna. The present invention and the display portion 9502 can be combined and formed on a same substrate.

Figure 25A:
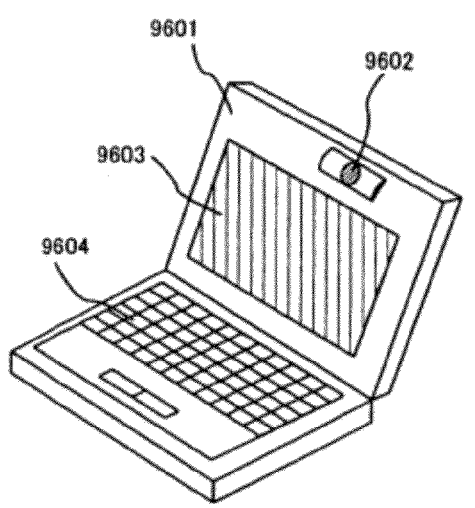
FIGS. 25A to 25D are diagrams showing examples of an image display apparatus.

FIG. 25A shows a personal computer, which is composed of a main body 9601, an image inputted portion 9602, a display portion 9603, and a key board 9604. The present invention and the display portion 9603 can be combined and formed on a same substrate.

Figure 25B:
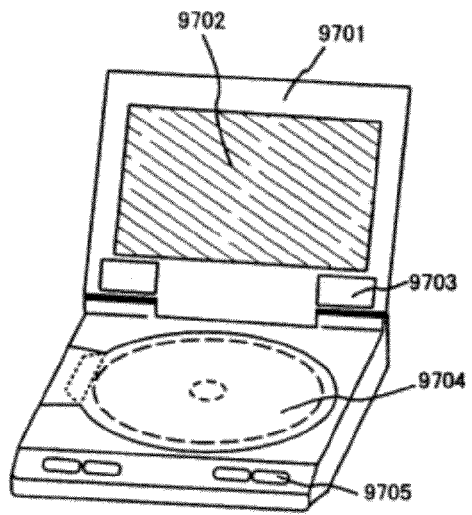

FIG. 25B shows a player using a recording medium (hereafter, referred to as a recording medium), which is composed of a main body 9701, a display portion 9702, a speaker portion 9703, a recording medium 9704, and operation switches 9705. This player uses DVD (digital versatile disc), CD, etc. for the recording medium, and can be used for music appreciation, film appreciation, games and Internet. The present invention and the substrate 9702 can be combined and formed on a same substrate.

Figure 25C:
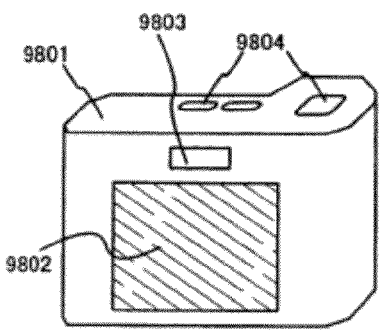

FIG. 25C shows a digital camera, which is composed of a main body 9801, a display portion 9802, a viewfinder portion 9803, operation switches 9804, and an image receiving portion (not shown in the figure). The present invention and the substrate 9802 can be combined and formed on a same substrate.

Figure 25D:
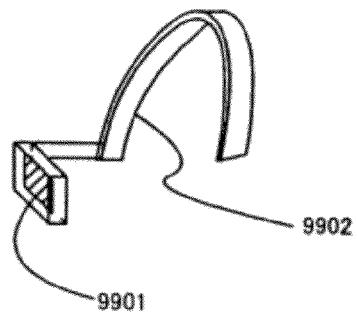

FIG. 25D shows a one-eyed head mounted display, which is composed of a display portion 9901 and head mounted portion 9902. The present invention and the display portion 9901 can be combined and formed on a same substrate.

As described above, the application range of the present invention is very wide and the present invention can be applied to electronic apparatus in various fields.

The sense amplifier according to the present invention can detect a potential difference between two input signals accurately in a transistor technology having large variation in threshold. Thus, the number of wrong operations can be extremely reduced. Since the sense amplifier can detect a small potential difference between input signals, the detection speed can be improved.

What is claimed is:

1. A circuit comprising:
a first line and a second line;
a first switch, a second switch, a third switch, a fourth switch, a fifth switch, and a sixth switch;
a first transistor; and
a first capacitor and a second capacitor,
wherein:
the first line is electrically connected to a first terminal of the first switch and a first terminal of the fifth switch;
a second terminal of the first switch is electrically connected to a first terminal of the first transistor;
a second terminal of the first transistor is electrically connected to a first terminal of the sixth switch and a second terminal of the fifth switch;
a second terminal of the second switch is electrically connected to a gate of the first transistor, a first terminal of the first capacitor, and a first terminal of the second capacitor;
a second terminal of the first capacitor is electrically connected to a first terminal of the third switch and a first terminal of the fourth switch; and
a second terminal of the sixth switch is electrically connected to the second line.

2. The circuit according to claim 1, wherein the second terminal of the first switch is electrically connected to a first terminal of the second switch.

3. The circuit according to claim 1, wherein a second terminal of the fourth switch is electrically connected to the second line.

4. The circuit according to claim 1, wherein the second terminal of the first transistor is electrically connected to a second terminal of the second capacitor.

5. The circuit according to claim 1, further comprising a third capacitor, wherein the second terminal of the first transistor is electrically connected to a first terminal of the third capacitor.

6. The circuit according to claim 1, further comprising a third capacitor,
wherein the fifth switch is a transistor, and
wherein a second terminal of the third capacitor is electrically connected to a gate of the fifth switch.

7. The circuit according to claim 1, further comprising an seventh switch electrically connected between the first line and the first switch.

8. The circuit according to claim 1, further comprising an eighth switch electrically connected between the first line and the fifth switch.

9. The circuit according to claim 8, further comprising a ninth switch electrically connected between the eighth switch and the fifth switch.

10. The circuit according to claim 1, wherein a second terminal of the third switch is electrically connected to an input terminal.

11. An electronic apparatus comprising the circuit according to claim 1.

12. A circuit comprising:
a first line and a second line;
a first switch, a second switch, a third switch, a fourth switch, a fifth switch, and a sixth switch;
a first transistor and a second transistor; and
a first capacitor, a second capacitor, and a third capacitor,
wherein:
the first line is electrically connected to a first terminal of the first switch;
a second terminal of the first switch is electrically connected to a first terminal of the first transistor;
a second terminal of the first transistor is electrically connected to a first terminal of the fourth switch and a first terminal of the second transistor;
a second terminal of the second switch is electrically connected to a gate of the first transistor, a first terminal of the first capacitor, and a first terminal of the second capacitor;
a second terminal of the first capacitor is electrically connected to a first terminal of the third switch and a first terminal of the fifth switch;
a gate of the second transistor is electrically connected to the first terminal of the third capacitor and a first terminal of the sixth switch; and
a second terminal of the third capacitor is electrically connected to the second line.

13. The circuit according to claim 12, wherein the second terminal of the first switch is electrically connected to a first terminal of the second switch.

14. The circuit according to claim 12, wherein the second terminal of the first transistor is electrically connected to a second terminal of the second capacitor.

15. The circuit according to claim 12, wherein a second terminal of the fifth switch is electrically connected to the second line.

16. The circuit according to claim 12, wherein a second terminal of the fourth switch is electrically connected to the second line.

17. The circuit according to claim 12, wherein a second terminal of the second transistor is electrically connected to a second terminal of the sixth switch.

18. The circuit according to claim 12, further comprising a seventh switch electrically connected between the first line and the first switch.

19. The circuit according to claim 12, further comprising an eighth switch electrically connected between the second line and the third capacitor.

20. The circuit according to claim 12, wherein the second line is electrically connected to the first terminal of the second transistor.

21. The circuit according to claim 12, further comprising a ninth switch electrically connected between the first line and the second transistor.

22. The circuit according to claim 21, further comprising a tenth switch electrically connected between the ninth switch and the second transistor.

23. The circuit according to claim 12, wherein a second terminal of the third switch is electrically connected to an input terminal.

24. An electronic apparatus comprising the circuit according to claim 12.

* * * * *